United States Patent
Matei et al.

(10) Patent No.: US 11,921,488 B2
(45) Date of Patent: Mar. 5, 2024

(54) SYSTEM AND METHOD FOR MACHINE-LEARNING-ENABLED MICRO-OBJECT DENSITY DISTRIBUTION CONTROL WITH THE AID OF A DIGITAL COMPUTER

(71) Applicant: XEROX CORPORATION, Norwalk, CT (US)

(72) Inventors: Ion Matei, Sunnyvale, CA (US); Johan de Kleer, Los Altos, CA (US); Christoforos Somarakis, Gilroy, CA (US)

(73) Assignee: XEROX CORPORATION, Norwalk, CT (US)

( * ) Notice: Subject to any disclaimer, the term of this patent is extended or adjusted under 35 U.S.C. 154(b) by 513 days.

(21) Appl. No.: 17/122,404

(22) Filed: Dec. 15, 2020

(65) Prior Publication Data
US 2022/0187785 A1 Jun. 16, 2022

(51) Int. Cl.
*G06F 30/398* (2020.01)
*G05B 13/04* (2006.01)
(Continued)

(52) U.S. Cl.
CPC ......... *G05B 19/402* (2013.01); *G05B 13/048* (2013.01); *G06T 1/20* (2013.01); *H04N 9/31* (2013.01); *G05B 2219/41345* (2013.01)

(58) Field of Classification Search
CPC .... G06F 18/2178; G06F 18/217; G06F 18/21; G06F 18/25; G06F 17/18; G06F 16/2477;
(Continued)

(56) References Cited

U.S. PATENT DOCUMENTS 6,243,696 B1 6/2001 Keeler
7,332,361 B2 2/2008 Lu et al.
(Continued)

FOREIGN PATENT DOCUMENTS

| CN | 101431665 | 5/2009 |
| EP | 1450304 | 8/2004 |
| WO | 2003081527 | 10/2003 |

OTHER PUBLICATIONS

Kumar, "Introduction to the Gradient Boosting Algorithm", May 2020, Analytics Vidhya, pp. 1-3 (Year: 2020).
(Continued)

*Primary Examiner* — Binh C Tat
(74) *Attorney, Agent, or Firm* — Leonid Kisselev

(57) ABSTRACT

System and method that to shape micro-object density distribution (how densely the micro-objects are assembled in particular spatial regions) are provided. A high speed camera tracks existing object density distribution. An array of photo-transistor-controlled electrodes is used to generate a dynamic potential energy landscape for manipulating objects with both DEP and EP forces, and a video projector is used actuate the array. One or more computing devices are used to: process images captured by the camera to estimate existing density distribution of objects; receive a desired density distribution of micro-objects; define a model describing a variation of micro-object density over time due to capacitance-based interactions; generate a sequence of electrode potential that when generated would minimize error between the existing density distribution and a desired density distribution; and use the sequences of electrode potentials to actuate the electrodes.

20 Claims, 31 Drawing Sheets

(51) Int. Cl.
*G05B 19/402* (2006.01)
*G06T 1/20* (2006.01)
*H04N 9/31* (2006.01)

(58) Field of Classification Search
CPC ............... G06F 18/00; G06F 2211/005; G06F 2218/00; G06F 16/2379; G06F 16/24; G06F 16/245; G06F 3/015; G06F 3/013; G06F 1/163; G06F 3/017; G06F 1/1626; G06F 1/1686; G06F 16/90; G06F 16/90335; G06F 2203/0381; G06F 3/038; G06F 3/147; G06F 30/27; G06F 21/6245; G06F 3/011; G06F 3/012; G06F 3/014; G06F 3/016; G06F 3/0426; G06F 30/23; G06F 30/392; G06F 7/5443; G06F 18/213; G06N 20/00; G06N 20/10; G06N 3/08; H01L 21/67242; H01L 27/14645; H01L 27/14649; H01L 27/14665; H01L 22/12
USPC ................................. 716/132–136, 100–106
See application file for complete search history.

(56) References Cited

U.S. PATENT DOCUMENTS

| | | | |
|---|---|---|---|
| 7,651,598 | B2 | 1/2010 | Shapiro et al. |
| 8,099,265 | B2 | 1/2012 | Houston |
| 8,110,083 | B1 | 2/2012 | Shapiro et al. |
| 9,892,225 | B2 | 2/2018 | Tirapu Azpiroz et al. |
| 9,996,920 | B2 | 6/2018 | Du et al. |
| 11,376,591 | B2 | 7/2022 | Lionberger et al. |
| 2002/0108097 | A1 | 8/2002 | Harris et al. |
| 2005/0051429 | A1 | 3/2005 | Shapiro et al. |
| 2005/0125474 | A1 | 6/2005 | Pednault |
| 2005/0149304 | A1 | 7/2005 | Harris et al. |
| 2008/0083621 | A1 | 4/2008 | Sideris |
| 2008/0088551 | A1 | 4/2008 | Cernasov |
| 2010/0329536 | A1 | 12/2010 | Muschler et al. |
| 2015/0076961 | A1 | 3/2015 | Thompson et al. |
| 2016/0171686 | A1 | 6/2016 | Du et al. |
| 2016/0351584 | A1 | 12/2016 | Lu et al. |
| 2016/0356696 | A1 | 12/2016 | Lewis et al. |
| 2016/0370266 | A1 | 12/2016 | White et al. |
| 2017/0102016 | A1 | 4/2017 | Azpiroz et al. |
| 2017/0221032 | A1* | 8/2017 | Mazed ................. G06Q 20/321 |
| 2018/0081347 | A1 | 3/2018 | Matei |
| 2018/0082826 | A1* | 3/2018 | Guha ................. H01L 21/3065 |
| 2019/0240665 | A1 | 8/2019 | Lionberger et al. |
| 2020/0207617 | A1 | 7/2020 | Plochowietz |
| 2020/0265296 | A1 | 8/2020 | Olabiyi |
| 2020/0342548 | A1* | 10/2020 | Mazed ............... G06Q 30/0631 |
| 2021/0316309 | A1 | 10/2021 | Hung et al. |
| 2021/0356951 | A1 | 11/2021 | Matei et al. |
| 2022/0130158 | A1 | 4/2022 | Kim et al. |
| 2022/0143612 | A1 | 5/2022 | Breinlinger et al. |
| 2022/0147672 | A1 | 5/2022 | Nistala |
| 2022/0152720 | A1 | 5/2022 | Hazui et al. |
| 2022/0188486 | A1* | 6/2022 | Matei ...................... B81C 3/004 |
| 2022/0245307 | A1 | 8/2022 | Kothnur |

OTHER PUBLICATIONS

Matei et al., "Micro-scale chiplets position control," Journal of Microelectromechanical Systems, 28(4):643-655, Aug. 2019.
Matei et al., "Towards printing as an electronics manufacturing method: Micro-scale chiplet position control," 2017 American Control Conference (ACC), pp. 1549-1555, May 2017.
Wang et al., "Dielectrophoretic manipulation of cells with spiral electrodes," Biophysical Journal, 72(4):1887-1899, 1999.
Tara D. Edwards and Michael A. Bevan, "Controlling colloidal particles with electric fields." Langmuir, 30(36):10793-10803, 2014. PMID: 24601635 ("Edwards").
Qian et al., "On-demand and location selective particle assembly via electrophoretic deposition for fabricating structures with particle-to-particle precision," Langmuir, 31(12):3563-3568, 2015. PMID: 25314133.
Grzelczak et al., "Directed self-assembly of nanoparticles," ACS Nano, 4(7):3591-3605, 2010. PMID: 20568710.
Paulson et al., "Control of self-assembly in micro-and nano-scale systems," Journal of Process Control, 27:38-49, 2015.
Mastrangeli et al., "Automated real-time control of fluidic self-assembly of microparticles," Robotics and Automation (ICRA), 2014 IEEE International Conference on pp. 5860-5865, May 2014.
Martin Abadi et al. TensorFlow: Large-scale machine learning on heterogeneous systems, 2015.
Tolley et al., "Dynamically programmable fluidic assembly," Applied Physics Letters, 93(25), 2008.
Mathai et al., "Simultaneous positioning and orientation of single nano-wires using flow control," RSC Adv., 3:2677-2682, 2013.
Probst et al., "Flow control of small objects on chip: Manipulating live cells, quantum dots, and nanowires," IEEE Control Systems, 32(2):26-53, Apr. 2012.
Camponogara et al., "Distributed model predictive control," Control Systems, IEEE, 22(1):44-52, Feb. 2002.
Garcia et al., "Model predictive control: Theory and practice—A survey," Automatica, 25(3):335-348, 1989.
Matthew Kelly, "An introduction to trajectory optimization: How to do your own direct collocation," SIAM Review, 59(4):849-904, 2017.
Al-Aradi et al., "Solving nonlinear and high-dimensional partial differential equations via deep learning," 2018.
Nocedal et al., "Numerical Optimization," Springer, New York, NY, USA, second edition, 2006.
A. O'Hagan, "Polynomial Chaos: A Tutorial and Critique from a Statistician's Perspective," University of Sheffield, UK, May 2013.
N. Wiener, "The Homogeneous Chaos," Am. J. Math., vol. 60, No. 4, pp. 897-936, 1938.
D. Xiu, D. Lucor, C.-H. Su, and G. Em Karniadakis, "Performance Evaluation of Generalized Polynomial Chaos," in Computational Science—ICCS 2003: International Conference, Melbourne, Australia and St. Petersburg, Russia, Jun. 2-4, 2003 Proceedings, Part IV, Berlin, Heidelberg, pp. 346-354, 2003.
Maclaurin et al., "Autograd: Effortless gradients in numpy," ICML 2015 AutoML Workshop, 2015.
D. P. Kingma and J. Ba, Adam: A Method for Stochastic Optimization. 2014.
Adam Paszke, Sam Gross, Soumith Chintala, Gregory Chanan, Edward Yang, Zachary DeVito, Zeming Lin, Alban Desmaison, Luca Antiga, and Adam Lerer. Automatic differentiation in pytorch. 2017.
Ralph C. Smith. Uncertainty Quantification: Theory, Implementation, and Applications. Society for Industrial and Applied Mathematics, Philadelphia, PA, USA, 2013.
Xue et al. "Optimal design of a colloidal self-assembly process," IEEE Transactions on Control Systems Technology, 22(5):1956-1963, Sep. 2014.
Xue et al., "Mdp based optimal control for a colloidal self-assembly system," American Control Conference (ACC), 2013, pp. 3397-3402, Jun. 2013.
Edman et al., Electric field directed assembly of an InGaAs LED onto silicon circuitry. IEEE Photonics Technology Letters, 12(9):1198-1200, Sep. 2000.
Zemánek, Jiří, Tomáš Michálek, and Zdeněk Hurák. "Phase-shift feedback control for dielectrophoretic micromanipulation." Lab on a Chip 18.12 (2018): 1793-1801.
Rupp et al., "Chiplet micro-assembly printer," 2019 IEEE 69th Electronic Components and Technology Conference (ECTC), pp. 1312-1315, May 2019.
Dongbin Xiu, Didier Lucor, C.-H. Su, and George Em Karniadakis. Performance evaluation of generalized polynomial chaos. In Computational Science—ICCS 2003: International Conference, Melbourne, Australia and St. Petersburg, Russia, Jun. 2-4, 2003 Proceedings, Part IV, pp. 346-354, Berlin, Heidelberg, 2003.
Zoran Zivkovic, "Improved adaptive gaussian mixture model for background subtraction," in Pattern Recognition, 2004. ICPR 2004.

(56) References Cited

OTHER PUBLICATIONS

Murran, Capacitance-based droplet position estimator for digital microfluidic devices, www.rsc.org/loc (year: 2012).

Armani, Control of miscrofluidic systems: Two examples, results, and challenges, Int. Journal of Robust and Nonlinear Control. (year: 2005).

Murran, Capacitance-based droplet position sensing optimization through digital microfluidic parameters, ASME 2011 (year: 2011).

Yang, Manipulation of droplets in microfluidic systems, Trends in Analytical Chemistry (Year: 2010).

Pollack et al., Electrowetting-based actuation of liquid droplets for microfluidic applications (e.g. Cite as: Appl. Phys. Lett. 77, 1725 ( 2000); https://doi.org/10.1063/1.1308534 Submitted: May 16, 2000 Accepted: Jul. 12, 2000 Published Online: Sep. 5, 2000 (Year: 2000).

Murran et al. (Capacitance-based droplet position estimator for digital microfluidic devices, 2012) (Year: 2012).

Lee, Jeong Hyun et al., "Mobile Oscillating Bubble Actuated by AC-Electrowetting-on-Dielectric (EWOD) for Microfluidic Mixing Enhancement", May 22, 2012, Sensors and Actuators A 182, Elsevier B.V. (Year: 2012).

http://web.archive.org/web/20201113180912/https://github.com/google/jax, cached on Nov. 13, 2020.

Matei et al., "Micro-Scale Chiplets Position Control" Journal of Microelectromechanical Systems, vol. 28, No. 4, Aug. 2019, p. 643-655 (Year: 2019).

Chow et al., "Micro-Object Assembly With an Optically Addressed Array" 2017 19th International Conference on Solid-State Sensors, Actuators and Microsystems (Transducers), Jul. 27, 2017, pp. 682-685 (Year: 2017).

\* cited by examiner

Particle density at t=1 sec.

Particle density at t=2 sec.

Particle density at t=5 sec.

Electrode potentials at t=0 sec.

Electrode potentials at t=1 sec.

Electrode potentials at t=2 sec.

Electrode potentials at t=3 sec.

Electrode potentials at t=4 sec.

Force vector fields at t = 3 sec.

Force vector fields at t = 4 sec.

Force vector fields at t = 5 sec.

Particle density at t=0 sec.

Particle density at t = 1 sec.

Particle density at t = 2 sec.

Particle density at t=3 sec.

Particle density at t=4 sec.

Electrode potentials at t=0 sec.

Electrode potentials at t=1 sec.

Electrode potentials at t=2 sec.

Electrode potentials at t=3 sec.

Electrode potentials at t=4 sec.

Electrode potentials at t=5 sec.

Force vector fields at t=0 sec.

Force vector fields at t=1 sec.

Force vector fields at t=2 sec.

Force vector fields at t=3 sec.

Force vector fields at t=4 sec.

Force vector fields at t=5 sec.

SYSTEM AND METHOD FOR MACHINE-LEARNING-ENABLED MICRO-OBJECT DENSITY DISTRIBUTION CONTROL WITH THE AID OF A DIGITAL COMPUTER

FIELD

This application relates in general to micro-assembly control, and in particular, to a system and method for machine-learning-enabled micro-object density distribution control with the aid of a digital computer.

BACKGROUND

Micro- and nano-scale particle manipulation has received a lot of research interest. The degree to which control can be exercised over assembly of micro-objects, objects whose dimensions measure in microns, and nano-objects, objects whose dimensions measure in nanometers, can make a significant difference in a number of technologies, including in micro-fabrication, biology and medicine. For example, manufacturing of reconfigurable electrical circuits can be improved by being able to accurately control position of micro-objects such as capacitors and resistors to manufacture a circuit with a desired behavior. Similarly, production of photovoltaic solar cell arrays can benefit from being able to put photovoltaic cells with certain qualities into particular positions on the arrays. Such cells can be too small to allow for a desired placement of the cells via human or robotic manipulation, and another kind of transportation mechanism is needed. Micro-assembly and nano-assembly of particles can also be used to engineer the microstructure of materials, such as of biological cells being assembled into tissue. Many other technological fields exist where increasing control over assembly of micro-and-nano objects can provide significant benefits.

A particular challenge relating to micro-assembly is generation of a particular desired density of the micro-objects in particular spatial regions; once achieved, this density distribution can serve as a basis for individual micro-object manipulations that can achieve a desired micro-object manipulation. However, simultaneous control and tracking of individual micro-objects is computationally expensive, and existing techniques do not allow for controlling density distribution of micro-objects with a degree of control and computational efficiency desired for many practical applications.

For example, uncontrolled mechanical agitation is typically used for directed particle assembly. However, this technique fails to achieve the near 100% yield necessary for certain industrial applications, such as electronics assembly.

Previous work has also attempted to use an electric field to direct movement of micro-objects. For example, in Matei et al., "Micro-scale chiplets position control," *Journal of Microelectromechanical Systems,* 28(4):643-655, August 2019, and Matei et al., "Towards printing as an electronics manufacturing method: Micro-scale chiplet position control," 2017 *American Control Conference (ACC),* pages 1549-1555, May 2017, the disclosures of which are incorporated by reference, a micro-chiplet control policy based on a one-step model predictive control approach is disclosed. The one-dimensional model disclosed is capacitance-based, but the actuation mechanism used was based on spiral-shaped electrode, which limited the number of simultaneously actuated electrodes that can be used by the model. Further, the sizes of the particles whose movement was controlled was assumed to be small enough not to disturb the electric field, which can limit applicability of the described techniques with larger particles.

Likewise, in Wang et al., "Dielectrophoretic manipulation of cells with spiral electrodes," *Biophysical Journal,* 72(4): 1887-1899, 199, describes studying the effect of dielectrophoresis on cancer cells]. This work assumes that the particles involved are spherical and small enough so that the electric field is not disturbed by their presence, limiting the applicability of the described techniques.

A control scheme for individual and ensemble control of colloids is described by Tara D. Edwards and Michael A. Bevan, "Controlling colloidal particles with electric fields." *Langmuir,* 30(36):10793-10803, 2014. PMID: 24601635 ("Edwards"), the disclosure of which is incorporated by reference. In particular, Edwards shows how inhomogeneous electric fields are used to manipulate individual and ensembles of colloidal particles (1 μm to 3 μm diameter) in water and sodium hydroxide solutions through electrophoresis and electroosmosis. The relative size of the colloids to the electrodes employed to generate the field, the medium in which the particles were immersed, and the resulting mathematical models, do not allow the described techniques to be used in certain industrial applications. In particular, the described techniques are not suitable for assembling micro-objects even slightly larger than those discussed in the Edwards paper. Further, the control schemes used involve high frequency signals (MHz), which further limits the applicability of such techniques.

Similarly, Qian et al., "On-demand and location selective particle assembly via electrophoretic deposition for fabricating structures with particle-to-particle precision," *Langmuir,* 31(12):3563-3568, 2015. PMID: 25314133, the disclosure of which is incorporated by reference, demonstrated single particle precision and location selective particle deposition, where electrophoretic forces are the primary drive for particle (2 μm polystyrene beads) manipulation. The control scheme employed was based on building large energy wells close to the desired location of the nano-particles. However, the described techniques does not allow for adequate sorting and placement of individual objects. Further, the described techniques do not allow to adequately manipulate asymmetric objects such as semiconductor chips, which require orientation control to be used to build up electronic systems.

Several works, such as Xue et al., "Optimal design of a colloidal self-assembly process," IEEE Transactions on *Control Systems* Technology, 22(5):1956-1963, September 2014, and Xue et al., "Mdp based optimal control for a colloidal self-assembly system," *American Control Conference (ACC),* 2013, pages 3397-3402, June 2013, the disclosures of which are incorporated by reference, describe controlling a stochastic colloidal assembly process that drive the system to the desired high-crystallinity state and that are based on a Markov-Decision Process optimal control policy. The dynamic model is based on actuator-parametrized Langevin equations. However, in these works, individual particles are not directly manipulated and how this approach can be used when assembling electrical circuits is unclear. Moreover, the size of the particles used (≈3 μm in diameter) is small to the extent that they pose little disturbance to the electric field that is completely shaped by an actuation potentials. In addition, the time scale for achieving the desired state would make the goal of high throughput using this approach challenging to achieve.

Other self-assembly control approaches, such as described by Grzelczak et al., "Directed self-assembly of nanoparticles," *ACS Nano*, 4(7):3591-3605, 2010. PMID: 20568710; Paulson et al., "Control of self-assembly in micro- and nano-scale systems," *Journal of Process Control*, 27:38-49, 2015; Mastrangeli et al., "Automated real-time control of fluidic self-assembly of microparticles," *Robotics and Automation (ICRA)*, 2014 *IEEE International Conference* on pages 5860-5865, May 2014; and Paulson et al., "Control of self-assembly in micro- and nano-scale systems," *Journal of Process Control*, 27:38-49, 2015, the disclosures of which are incorporated by reference, do not, as they are, allow to easily scale the number of objects being moved.

Water-based solution in which particles are immersed is a popular choice of control medium, such as described by Edman et al., "Electric field directed assembly of an ingaas led onto silicon circuitry. *IEEE Photonics Technology Letters*, 12(9):1198-1200, September 2000 and Tolley et al., "Dynamically programmable fluidic assembly," *Applied Physics Letters*, 93(25), 2008, the disclosures of which are incorporated by reference. In such cases, both electrophoretic forces as well as fluid motions of electro-osmotic flows are used to drive particles. However, water does not behave like a dielectric, hence cannot generate electric fields, resulting in lower forces for moving objects, thus significantly limiting the size of objects that can be moved using this setup.

Accurate control of cells, quantum dots and nano-wires bases on electroosmosis is used in Mathai et al., "Simultaneous positioning and orientation of single nano-wires using flow control," *RSC Adv.*, 3:2677-2682, 2013 and Probst et al., "Flow control of small objects on chip: Manipulating live cells, quantum dots, and nanowires," *IEEE Control Systems*, 32(2):26-53, April 2012, the disclosures of which are incorporated by reference. The authors use linear models of the electrodes potentials, and the particles effect on the electric field distribution is negligible. However, the presented linearity in the electrodes potentials does not hold when driving forces are primarily dielectrophoretic, thus limiting the applicability of these techniques. Further, the presented linearity may not hold with objects on a micro-scale.

Finally, Zemánek et al., 'Feedback-controlled dielectrophoretic micromanipulation," 2018 *International Conference on Manipulation, Automation and Robotics at Small Scales (MARSS)*, July 2018, the disclosure of which is incorporated by reference, describe a dielectrophoresis-based feedback for micro-sphere manipulation. The authors use a simulated annealing approach for solving the optimal control problem, where they take advantage of a sphere-like shape of the particle when building the system model. However, due to the dependence of this technique on the spherical shape of the particle being moved, limits the applicability of the technique.

Therefore, there is a need for an easily scalable, computationally-efficient, way to control density distribution of micro-objects.

SUMMARY

System and method that allow to shape micro-object density distribution (how densely the micro-objects are assembled in particular spatial regions) are provided. A high speed camera tracks existing object density distribution. An array of photo-transistor-controlled electrodes is used to generate a dynamic potential energy landscape for manipulating objects with both DEP and EP forces, and a video projector is used actuate the array. One or more computing devices are used to: process images captured by the camera to estimate existing density distribution of objects; receive a desired density distribution of micro-objects; define a model describing a variation of micro-object density over time due to capacitance-based interactions; generate a sequence of electrode potential that when generated would minimize error between the existing density distribution and a desired density distribution; and map the sequences of electrode potentials to images that are projected on the array using a video projector. The projected images activate or deactivate electrodes, as indicated by the electrode potentials. Machine learning algorithms, such as automatic differentiation, are used to increase the efficiency of optimizing the sequence of electrode potentials.

In one embodiment, a system and method for micro-object density distribution control with the aid of a digital computer are provided. One or more parameters of a system for positioning a plurality of micro-objects are obtained by one or more processors configured to execute computer-executable code, the system including a plurality of programmable electrodes, the electrodes configured to induce a movement of the micro-objects when the micro-objects are proximate to the electrodes upon a generation of one or more electric potentials by one or more of the electrodes. A model describing a variation of micro-object density over time due to capacitance-based interactions is defined by one or more of the processors based on the parameters of the system. A density distribution of the micro-objects is estimated by one or more of the processors using at least one sensor. A target density distribution of the micro-objects is received by one or more of the processors. Model predictive control (MPC) optimization is performed by one or more of the processors to derive based on the density model a sequence of the electrode potentials to be generated by at least some of the electrodes for moving at least some of the micro-objects to minimize an error between the estimated density distribution and the target density distribution. At least some of the electrodes are actuated by one or more of the processors to generate the sequence of the electrode potentials.

Still other embodiments of the present invention will become readily apparent to those skilled in the art from the following detailed description, wherein is described embodiments of the invention by way of illustrating the best mode contemplated for carrying out the invention. As will be realized, the invention is capable of other and different embodiments and its several details are capable of modifications in various obvious respects, all without departing from the spirit and the scope of the present invention. Accordingly, the drawings and detailed description are to be regarded as illustrative in nature and not as restrictive.

DETAILED DESCRIPTION

Figure 1:
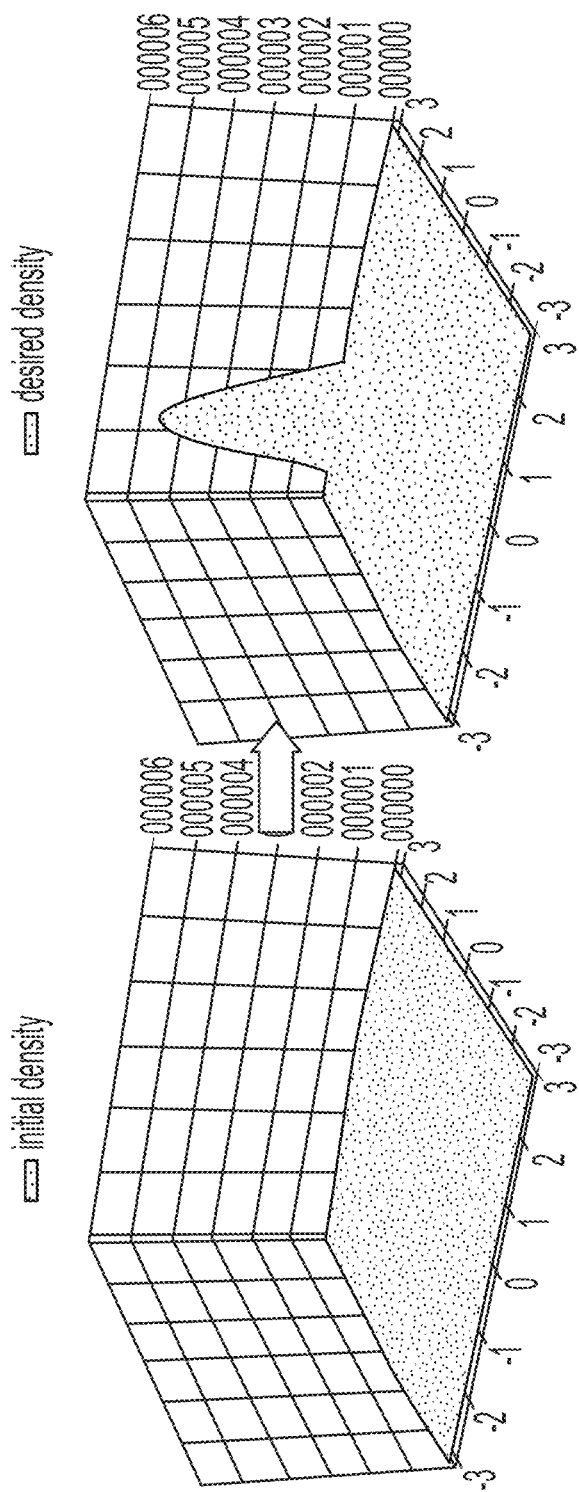
FIG. 1 is a diagram illustrating a control objective in which initially micro-objects have a uniform distribution and subsequently converge to a multivariate Gaussian distribution, centered at zero and with a given covariance matrix.

Simultaneous control and tracking of individual chiplets is computationally expensive. Computational expense of simultaneously moving a plurality micro-objects can be decreased by first executing micro-object control at a macro level: tracking and controlling the micro-object density and bringing the density to a desired shape by changing the electrode potentials. An example of the control objective is graphically depicted with reference to FIG. 1. FIG. 1 is a diagram illustrating a control objective in which initially micro-objects have a uniform distribution and subsequently converge to a multivariate Gaussian distribution, centered at zero and with a given covariance matrix. Such control objective can be accomplished using the system and method described below, which utilize an array of electrodes that generates an electric field that causes micro-objects to move. To design the sequence of electrode potentials generated by the electrodes necessary to achieve the desired density distribution, first a macro-level mathematical model is generated based on physical laws governing the behavior of the micro-object under the electric field. This macro-model describes the evolution of the micro-object density $f(x, t)$ as a result of changing the electric filed through the electrode potentials. The objective of density control is to shape the micro-object density into a desired pattern $f_d(x, t)$ (e.g., Gaussian). A model predictive control (MPC) problem where the loss function is the Kullback-Leibler divergence between the current micro-object density and the desired micro-object density, over some time horizon.

Figure 2:
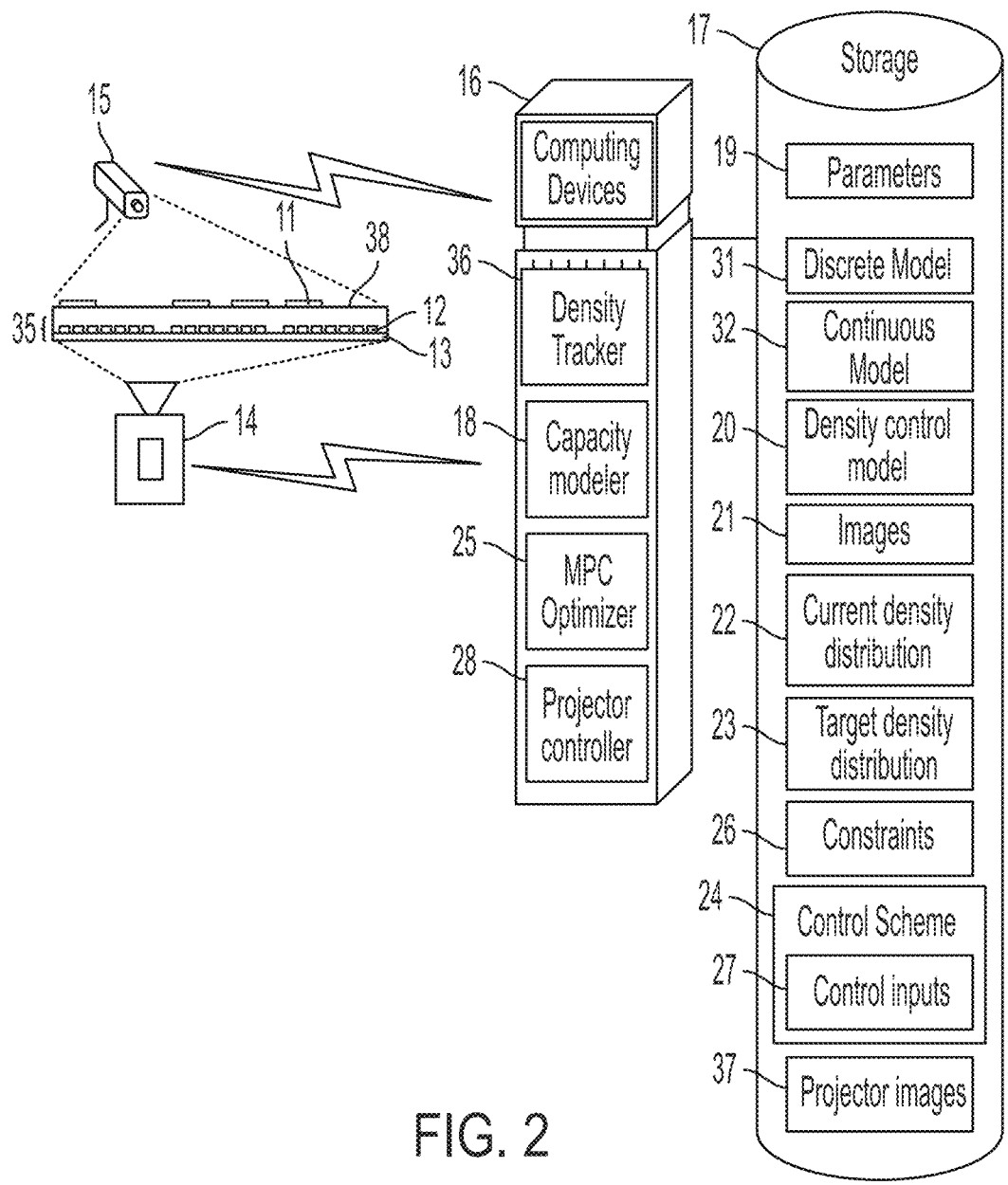
FIG. 2 is a block diagram showing a system for machine-learning-enabled micro-object density distribution control with the aid of a digital computer.

FIG. 2 is a block diagram showing a system 10 for machine-learning-enabled micro-object density distribution control with the aid of a digital computer. The system 10 allows for coordinated assembly involving multiple objects 11, such as micro-objects. The size of the objects 11 vary between being on the nano scale (<1 μm), and micro-scale (as much as 100s of μm), though other sizes are possible. The objects 11 can be spherical, though other shapes are also possible, such as a rectangular shape, though still other shapes are also possible. In one embodiment, the diameter of the spherical objects 11 can be 20 μm to 50 μm, though other diameters are also possible. In one embodiment, the dimension of the rectangular objects 11 can be 200 μm×300 μm×100 μm, though other dimensions are also possible. The objects 11 are immersed in a dielectric fluid (not shown) contained within an enclosure (not shown), with a layer of film 38 being below the dielectric fluid contained within the enclosure. In one embodiment, the dielectric fluid (not shown) is Isopar® M, manufactured by ExxonMobil Chemical Company of Spring, Texas, though other dielectric fluids are also possible. The dielectric fluid can include one or more additives, such as with di-2-ethylhexylsulfosuccinate (AOT) charge director molecules, though other additives are also possible. The objects 11 can be made out of aluminium oxide (AlOx), though other materials are possible. Each of the objects 11 can be a semiconductor chip, an integrated circuit, a particle, a nanodevice or structure, or any object which an array 35 of electrodes 12 can physically manipulate. In the description below, the objects 11 are referred to interchangeably as chiplets 11 or micro-objects 11, though other ways to refer to the objects 11 are possible. In one embodiment, the film 38 can be a 50 μm thick perfluoroalkoxy (PFA) film, though other kinds of film of other thicknesses are possible.

Below the suspended chiplets 11 are a plurality of electrodes 12 forming an array 35, the electrodes configured to generate a dynamic potential energy landscape for manipulating objects with both dielectrophoretic ("DEP") and electrophoretic ("EP") forces. The film is laminated on the electrodes 12. In one embodiment, the electrodes can be square shapes and made off copper, though other shapes and materials are also possible. In one embodiment, the dimensions of a square electrode 12 can be a 16 μm width and 100 nm thickness, though other dimensions are also possible in a further embodiment. The array 35 can include multiple rows of the electrodes 12, with each row including multiple electrodes 12.

The electric potentials generated by the electrodes 12 are controlled by array 13 of photo-transistors, the array including an active-matrix photo-transistor backplane that is set on glass. The multiple photo-transistors on the backplane form the array 13, with each of the photo-transistors in the array 13 being in control of the electric potentials generated by a single electrode 12. In particular, each of the photo-transistors in the array 13 is attached to one electrode 12. The array 13 of phototransistors can have additional characteristics, such as those described in Rupp et al., "Chiplet micro-assembly printer," 2019 *IEEE 69th Electronic Components and Technology Conference (ECTC)*, pages 1312-1315, May 2019, the disclosure of which is incorporated by reference.

Figure 3:
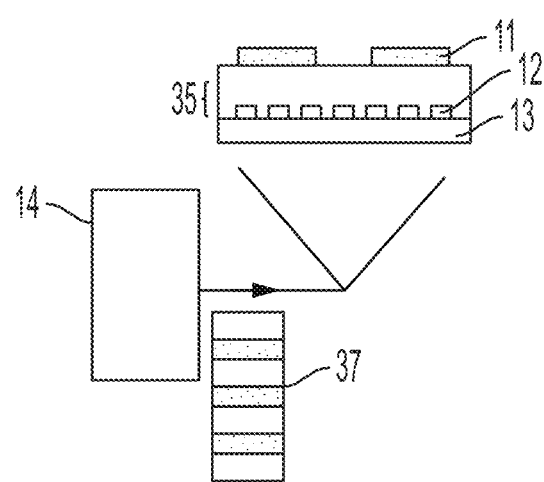
FIG. 3 is a diagram illustrating interactions between the video projector and the photo-transistor array of FIG. 2 in accordance with one embodiment.

The array 13 is optically addressed by a video projector 14 to enable dynamic control of the electrostatic energy potential and manipulation of the positions of multiple chiplets 11 at the same time. In particular, the video projector 14 is used to address each photo-transistor controlled electrode 12, as illustrated by FIG. 3, allowing for facile zoom factor changes and stitching into larger arrays. FIG. 3 is a diagram illustrating interactions between the video projector 14 and the photo-transistor array 13 of FIG. 2 in accordance with one embodiment. The video projector 14 actuates the electrodes 12 by projecting pre-defined patterns: images 37 that are generated based on control inputs: the electric potentials to be generated by the electrodes to achieve desired motion of the chiplets 11, as further described below. The pixelated light projected by the projector 14 that makes up the images charges each individual phototransistor 13 in the array to the degree necessary so that the electrode 12 charged by that phototransistor produces the desired electric potential. Additional information regarding the phototransistor array 13 is described in in U.S. patent application Ser. No. 17/098,816, filed Nov. 16, 2020, entitled System and Method For Multi-Object Micro-Assembly Control With The Aid of A Digital Computer, to Matei et al., the disclosure of which is incorporated by reference.

In a further embodiment, the array 35 of the electrodes 12 could be programmable to generate a necessary sequence of electric potentials in a way other than through the user of the photo-transistor array 13, such as through the use of a memory based array in which electrodes are activated via a specific memory address.

Returning to FIG. 2, the system 10 further includes a high speed camera 15 that tracks locations of the chiplets 11 being moved and can be used to estimate chiplet 11 density distribution. In a further embodiment, other kinds of sensors could be used to estimate and track positions of chiplets 11 and chiplet density distribution. Both the video projector 14 and the camera 15 are interfaced to one or more computing devices 16, which can control the electrodes 12 through the projector 14 to induce a formation of a desired chiplet density distribution. Other chiplet 11 patterns are also possible.

The connections between the one or more computing devices 16 can be direct, such as a via wires or a wireless connection to physically proximate one or more computing devices 16, or the connection can be via an Internetwork to physically remote one or more computing devices 16, such as via the Internet or a cellular network. The one or more computing devices 16 include a plurality of computer processors that are specialized to perform data processing in parallel. In one embodiment, the computer processors can be graphics processing unit (GPU). In a further embodiment, the computer processors can be tensor processing units (TPUs), developed by Google, LLC of Mountain View, California, which are particularly specialized for neural network machine learning. In a still further embodiment, the computer processors can include both GPUs and TPUs. In a still further embodiment, the computer processors can include other types of processors specialized for parallel processing.

Figure 4:
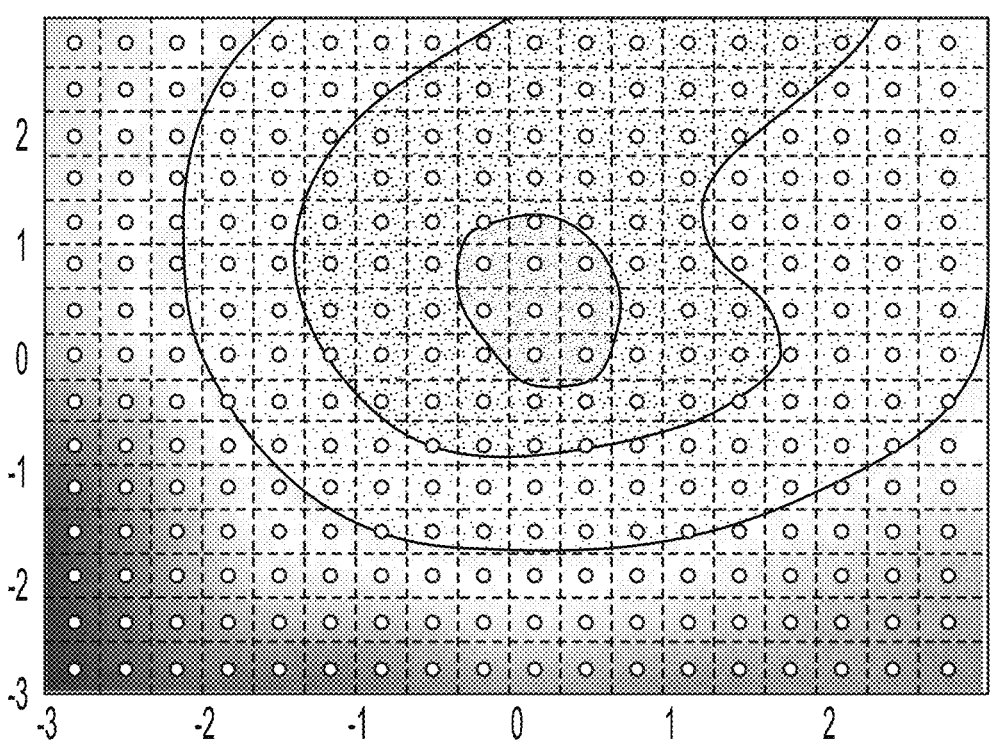
FIG. 4 is a diagram showing a discrete grid superimposed on an continuous potential function, with the center of each grid representing an electrode.

As further described below, in detail, the one or more computing devices 16 perform an optimization-based machine-learning (ML) algorithm uses the mathematical macro-model and the cost function to compute the chiplet density $f(x, t)$ and a continuous function $V(x, t)$ that allocates electrode potentials, where x is a 2D position and t is the time. The computing devices 16 shape the electric field through a discrete geometry of electrodes (e.g., grid structure). Given a discretization of the continuous plane (i.e., a grid of electrode), the computing devices 16 can compute the electric potential of a discrete point by integrating the potential field on a neighborhood of the discrete point, based on the discretization scheme, with an example of such discretization imposed on the continuous electric potential function $V(x, t)$ being seen with reference to FIG. 4. FIG. 4 is a diagram showing a discrete grid superimposed on an continuous potential function, with the center of each grid representing an electrode 12. Grayscale portions of the FIG. 4 refer to low electrode potential values—the darker the grayscale colors in a portion of the FIG. 4, the lower the magnitude of the potentials being in that portion of the FIG. 4. Stippled portions of the FIG. 4 refer to high electric potential values—the denser the stippling in a portion of the FIG. 4, the larger the potential magnitude in that portion of the FIG. 4. The electric field $E(x, t)=\nabla V(x, t)$ can be computed using automatic differentiation. Then the electric potential at a point $x_i$, the center of the grid rectangle $X_i$, is computed as $V(x_i)=\int_{X_i} E(x)dx$.

While the one or more computing devices 16 are shown as a server, other types of computer devices are possible. The computing devices 16 can include one or more modules for carrying out the embodiments disclosed herein. The modules can be implemented as a computer program or procedure written as source code in a conventional programming language and is presented for execution by the processors as object or byte code. Alternatively, the modules could also be implemented in hardware, either as integrated circuitry or burned into read-only memory components, and each of the computing devices 16 can act as a specialized computer. For instance, when the modules are implemented as hardware, that particular hardware is specialized to perform the computations and communication described above and other computers cannot be used. Additionally, when the modules are burned into read-only memory components, the computer storing the read-only memory becomes specialized to perform the operations described above that other computers cannot. The various implementations of the source code and object and byte codes can be held on a computer-readable storage medium, such as a floppy disk, hard drive, digital video disk (DVD), random access memory (RAM), read-only memory (ROM) and similar storage mediums. Other types of modules and module functions are possible, as well as other physical hardware components. For example, the computing device 16 can include other components found in programmable computing devices, such as input/output ports, network interfaces, and non-volatile storage, although other components are possible. In the embodiment where the computing devices 16 are servers, the server can also be cloud-based or be dedicated servers.

The one or more computing devices 16 are interfaced to a storage 17 and execute a capacity modeler 18 that obtains parameters 19 of the system 10, stores the parameters 19 in the storage 17, and models capacitance between the electrodes 12 and the chiplets 11 as well as between the chiplets 11 themselves. The parameters 19 can include the diameter of the chiplets 11, the dimensions of the electrodes 12, the dielectric fluid constant (e.g. as $\varepsilon=2$), the fixed positions of the electrodes 12, material of the chiplets 11 and electrodes 12, and the vertical distance between the chiplets 11 and the electrodes 12 ("height" of the chiplets 11). Other parameters 19 are still possible.

The capacity modeler 18 creates a capacitance-based dynamic model 20 for chiplet density. The capacity modeler 18 starts with a model 31 induced by a discrete (e.g., grid) electrode array 35. Next, the capacity modeler 18 passes from this discrete representation of potentials to a model 32 with continuous one, with the assumption that the potentials are a continuum. The last step is to convert the continuous, single chiplet model 32 into a chiplet density dynamical model 20 by means of mean field approximation theory.

A 2D model 31 for the chiplet 11 motion under the effect of the potential field induced by the electrode array 12 is described below. The model is for one chiplet 11 only and omits possible interactions when chiplets 11 get close the each other (with the exact distance at which one chiplet 11 needs to stay away from another chiplet 11 to avoid causing interactions that need to be accounted for being determined in accordance with the geometry and electric potential of the micro-objects—generally, to cause chiplet-chiplet interactions, the distance between two chiplets has to be on the same order of magnitude as the distance from chiplets 11 to electrodes 12).

Figure 5:
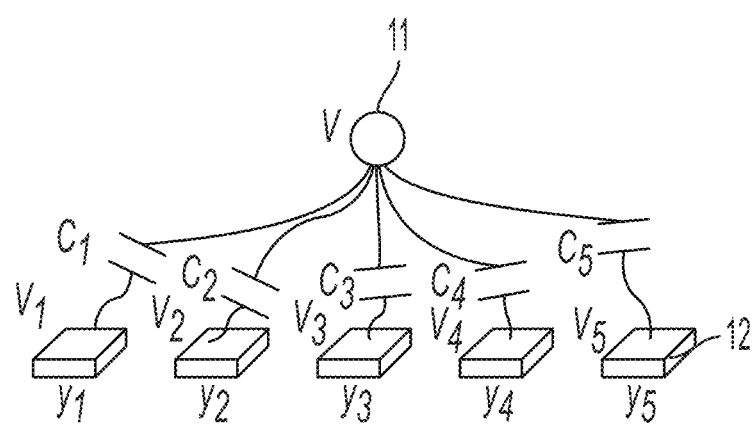
FIG. 5 is diagram illustrating capacitive-based interactions between one chiplet and five electrodes of the system of FIG. 2 in accordance with one embodiment.

The result of applying electric potentials to the electrodes 12 is the generation of DEP forces that act on the chiplets 11. A viscous drag force proportional to the velocity opposes the chiplet's motion, with the drag force being proportional to the velocity in non-turbulent flows, that is, when the Reynolds number is small. Due to the negligible mass of the chiplet, acceleration is ignored. Thus, the dynamical model for the chiplet 11 motion can be described by:

$$\mu \dot{x} = F_x(x,y) \quad (1)$$

$$\mu \dot{y} = F_y(x,y), \quad (2)$$

where (x, y) denotes the chiplet position measured at chiplet's center of mass, $\mu$ is the fluid dependent viscous coefficient, and $F_x(x, y)$ and $F_y(x, y)$ are projections on the x and y axis, respectively of the force induced by the potential field. The forces $F_x$ and $F_y$ as functions of the potential energy of the chiplet 11. The capacity modeler 18 computes the potential energy by using a capacitive-based electrical circuit that lumps the interaction between the electrodes and the chiplet. Such a circuit is shown with reference to FIG. 5, where only one row with five electrodes 12 of the array 35 is depicted. FIG. 5 is diagram illustrating capacitive-based interactions between one chiplet 11 and five electrodes of the system of FIG. 2 in accordance with one embodiment. The chiplet 11 and the electrodes 12 act as metal plates; hence the capacitances of these capacitors are dependent on the chiplet position. As expected, the maximum values are attained when the chiplet's 11 position maximizes the overlap with the electrodes 12. To simplify the analysis, the analysis is limited to low frequency region only, where the dielectric constant is not frequency dependent.

The forces $F_x$ and $F_y$ can be formally expressed as $$F_x(x, y) = \frac{\partial U}{\partial x}(x, y) \text{ and } F_y(x, y) = \frac{\partial U}{\partial y}(x, y),$$

where U(x, y) is the potential energy of the chiplet 11, given by:

$$U(x,y) = \tfrac{1}{2}\sum_{i=1}^{N} C_i(x,y)[V_i - V(x,y)]^2, \quad (3)$$

where $C_i(x, y)$ is the capacitance between the chiplet and electrode i, $V_i$ is the electric potential of electrode i, V(x, y) is the electric potential of the chiplet assumed uniformly distributed across the chiplet, and N is the number of actuated electrodes. In the potential energy expression, we ignore the electrophoretic effects found negligible. The chiplet potential can be explicitly computed in terms of the electrode potentials, by solving for the voltages and currents in the electrical circuit shown with reference to FIG. 5. In particular the steady state chiplet potential is given by $$V(x, y) = \frac{1}{\sum_{i=1}^{N} C_i(x, y)} \sum_{i=1}^{N} C_i(x, y) V_i, \quad (4)$$

Feedback control design requires explicit expressions for the capacitances between the chiplet 11 and electrodes 12. The capacitance modeler 18 creates the chiplet motion model using high fidelity simulations using the COMSOL Multiphysics® software developed by COMSOL, Inc. of Burlington, MA ("COMSOL"), though other kinds of simulations using other kinds of software are also possible. For symmetric chiplets (e.g., beads) assuming the electrodes are symmetric also, the capacitances are estimated by simulating a 2-dimensional electrostatic COMSOL model. This implies that the capacitance function is of the form $C_i(\eta) = C(\|\eta - \eta_i\|)$, where $\eta^T = [x, y]$ denotes the chiplet position, and $\eta_i^T = [x_i, y_i]$ is the fixed position of electrode i.

Figure 6:
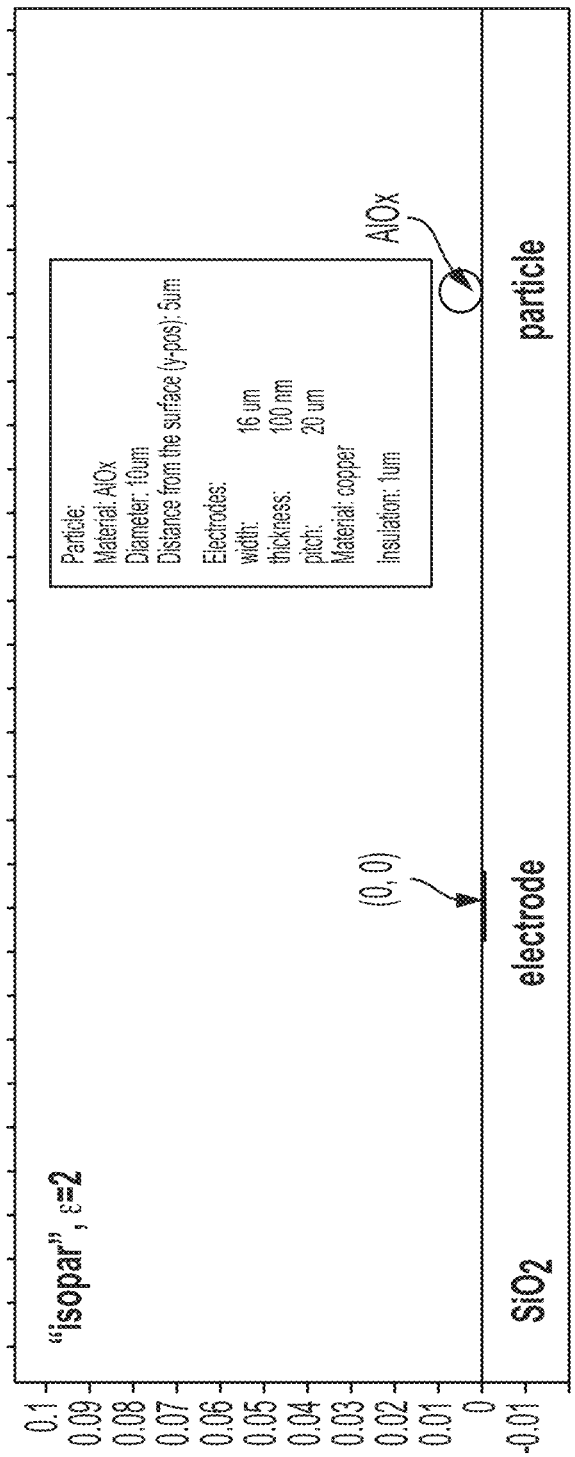
FIG. 6 is a diagram showing the COMSOL model of two conductors (spherical chiplet and an electrode) for capacitance computation in accordance with one embodiment.

FIG. 6 is a diagram showing the COMSOL model of two conductors (spherical chiplet and an electrode) for capacitance computation in accordance with one embodiment. As shown with reference to FIG. 6, in the COMSOL model, a 16 µm width and 100 nm thickness copper plate, and a 10 µm diameter, aluminium oxide (AlOx) spherical object are surrounded by a dielectric with the same properties as the isopar-M solution.

The quasi-static models are computed by the capacity modeler 18 in form of electromagnetic simulations using partial differential equations, where we use ground boundary (zero potential) as the boundary condition. The capacitance matrix entries are computed from the charges that result on each conductor when an electric potential is applied to one of them and the other is set to ground. The COMSOL simulations do reflect the field distortion when the chiplet 11 approaches the electrode 12. The COMSOL electrostatic model has as parameters, the diameter of the sphere, the electrode dimensions, the dielectric fluid constant ($\varepsilon=2$) and the positions and material of the sphere and electrode. The chiplet 11 height is fixed (z=5 µm) and the chiplet 11 position on the x-axis over the interval [−1 mm, 1 mm]. Note that due to the size of the chiplet 11 versus the size of the electrodes 12, fringe effects (electric field distortions at the edges) are significant. Off-line simulations are performed for a range of chiplet positions: $x \in$ [−1 mm, 1 mm] and z=5 µm. The capacitances between the electrode and the chiplet 11 are evaluated for all considered positions. The capacitance function is parametrized using error functions:

$$C(\xi) = \sum_{i=1}^{m} a_i \left[ \Phi\left(\frac{\xi + \delta}{c_i}\right) - \Phi\left(\frac{\xi - \delta}{c_i}\right) \right], \text{ where } \Phi(\xi) = \frac{1}{\sqrt{\pi}} \int_{-\xi}^{\xi} e^{-t^2} dt$$

is the error function, $\xi$ is the distance between the center of the sphere and the electrode center assumed at the origin, $a_i$ and $c_i > 0$ are positive scalars, and $\delta$ is half of the electrode pitch, i.e., 10 µm in this example.

Figure 7:
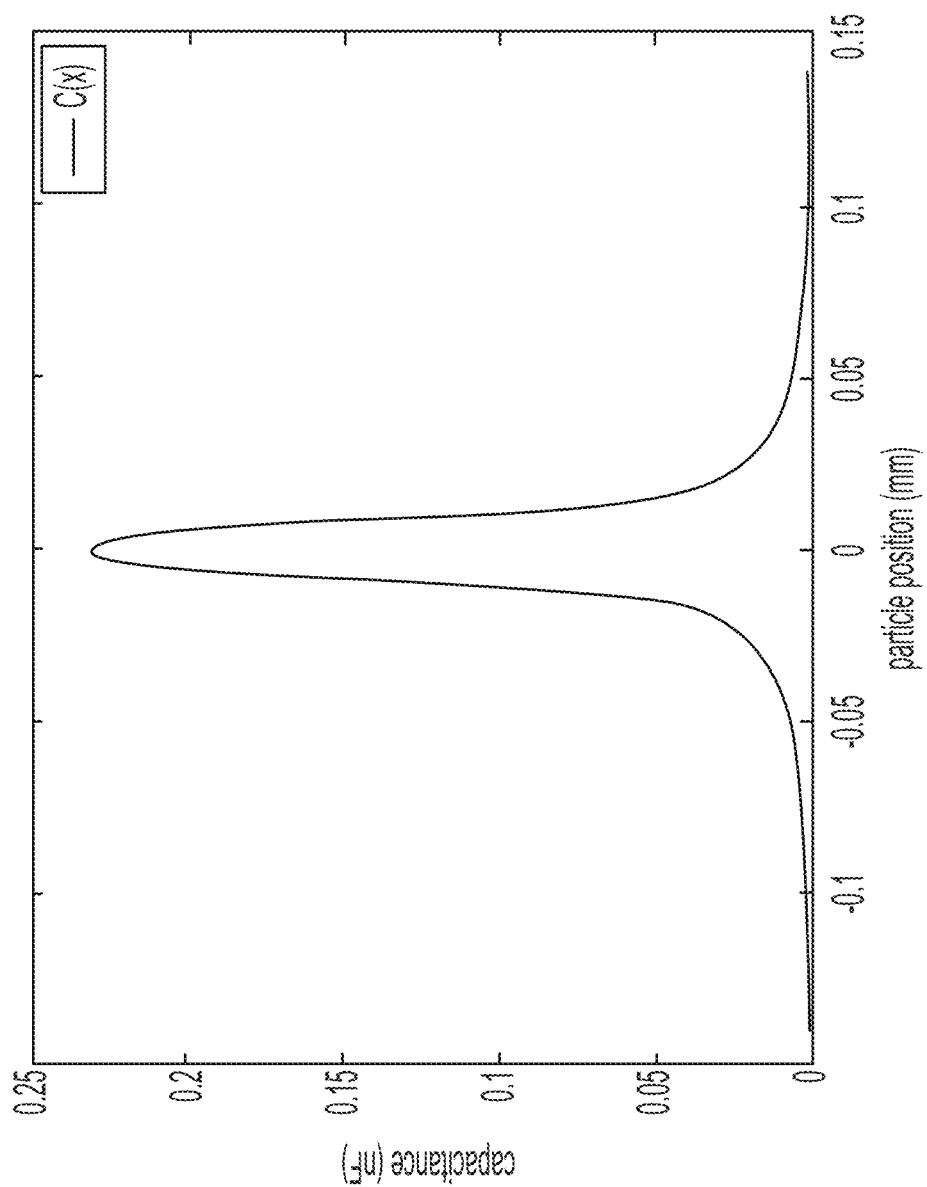
FIG. 7 shows the capacitance function fitted with training data generated by COMSOL simulations in accordance with one embodiment.

FIG. 7 shows the capacitance function fitted with training data generated by COMSOL simulations in accordance with one embodiment. FIG. 7 depicts $C(\xi)$, the capacitance between the chiplet and the electrode as a function of the chiplet horizontal position, where the numerical values were fitted on the error function parameterization. The capacity modeler 18 can map the 1D model to a 2D model by using the transformation $\xi \to \sqrt{x^2 + y^2}$, which results in a capacitance function $$C(x, y) = \sum_{i=1}^{m} a_i \left[ \Phi\left(\frac{\sqrt{x^2+y^2}+\delta}{c_i}\right) - \Phi\left(\frac{\sqrt{x^2+y^2}-\delta}{c_i}\right) \right].$$

Figure 8:
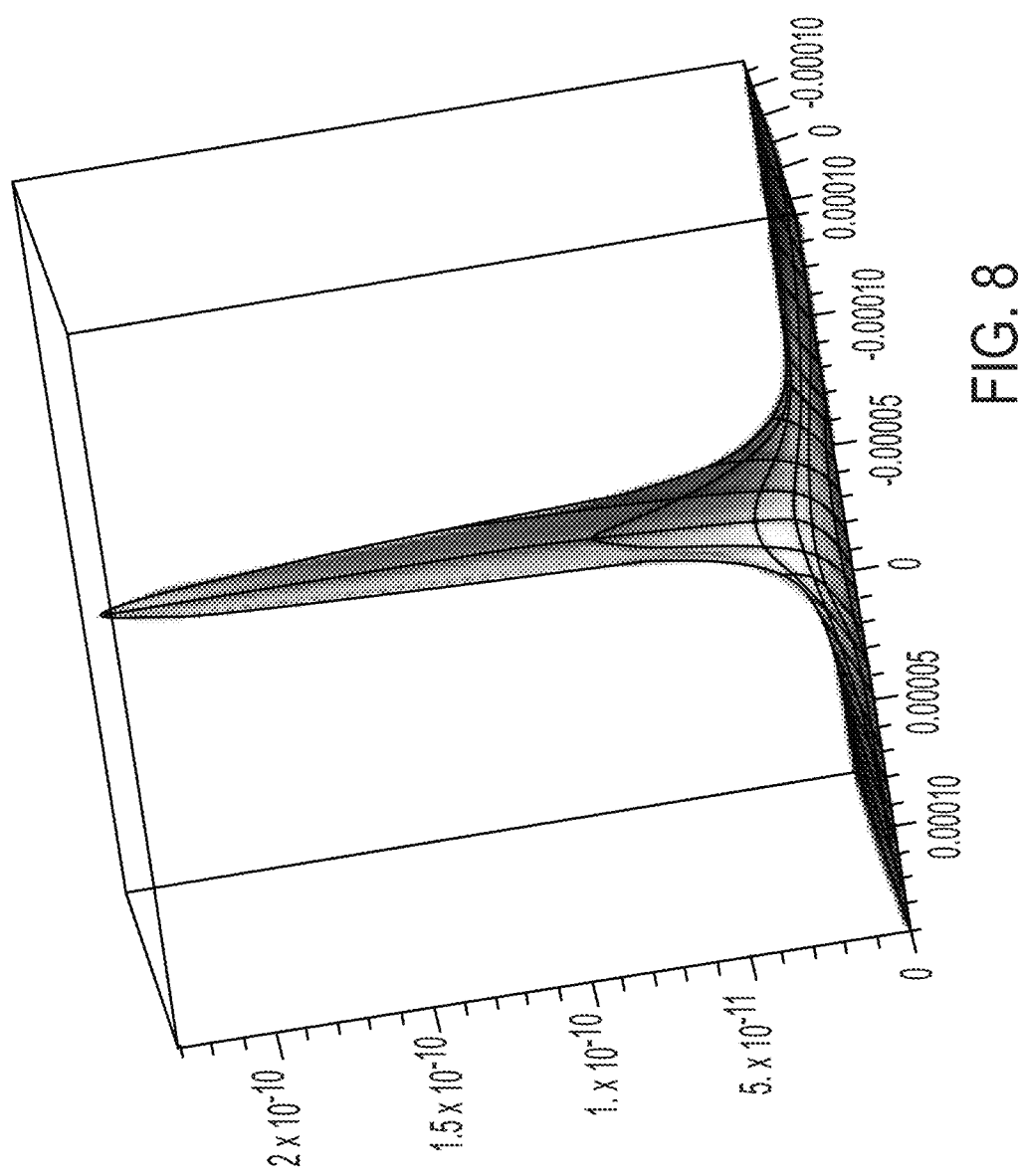
FIG. 8 is a diagram showing 2D capacitance function determined from the 1D model using the symmetry property in accordance with one embodiment.

For the sphere shape chiplet 11, considering only one term in the parameterization of the capacitance function is enough, and the resulting 2D shape is depicted with reference to FIG. 8. FIG. 8 is a diagram showing 2D capacitance function determined from the 1D model using the symmetry property in accordance with one embodiment.

The intuition behind going from a model 31 with a discrete representation to a model 32 with a continuous representation can be seen in the expression of the chiplet 11 potential $$V(x) = \frac{1}{\sum_{k=1}^{N} c_{i(x)}} \sum_{k=1}^{N} C_i(x) V_i.$$

In particular $V(x)$ can be interpreted as the expected value of a discrete random function $V(Y)$ over a discrete distribution $p_i(x) = C_i(x)/\Sigma_{i=1}^{N} C_i(x) = \tilde{C}_i(x)$. The mass function $p_i(x)$ can be interpreted as a conditional probability $p_i(x) = \Pr(Y = y_i | X = x)$, and hence the chiplet 11 potential can be expressed as $V(x) = E[V(Y)|X=x]$, where $V(y)$ is a function that reflects the potential at each point y. The discrete probability distribution can be seen as a discretization of a continuous probability distribution, i.e., $p_i(x) = \int_{y_i-\delta}^{y_i+\delta} f(y|x) dy$, where $y_i$ is the position of the $i^{th}$ electrode and $\delta$ is half of the electrode pitch. The parameterization of the capacitance function in terms of the error functions tells that the conditional probability density function (pdf) is a mixture of Gaussian functions. For the sphere shaped example, the mixture has only one term, and hence the capacitance is expressed as $$C_i(x) = a\left[\Phi\left(\frac{x-y_i+\delta}{c}\right) - \Phi\left(\frac{x-y_i-\delta}{c}\right)\right] = 2af(y|x),$$

where $f(y|x) = \frac{1}{\sqrt{2\pi\sigma^2}} e^{-\frac{(y-x)^2}{2\sigma^2}}$, with $\sigma = \frac{c}{\sqrt{2}}$.

Therefore, the chiplet potential in the continuous representation can be expressed as $\bar{v}(x) = E[V(Y)|X=x]$, where Y is a continuous random variable with a Gaussian distribution, i.e., $Y \sim \mathcal{N}(X,\sigma)$, and $V(Y)$ is a function which assigns an electric potential to each point y. The potential energy can now be represented as $U(x) = aE[(V(Y)-\bar{v}(X))^2|X=x]$, and thus the 1D chiplet dynamics is given by the following partial differential equation $$\frac{\partial x}{\partial t} = \frac{\partial U(x)}{\partial x}. \quad (5)$$

where $U(x) = aE[(V(Y)-\bar{v}(X))^2|X=x]$, and $\bar{v}(x) = E[V(Y)|X=x]$.

By $x=(x_1, x_2)$ is denoted the chiplet position and by $y^{(i)} = (y_1^{(i)}, y_2^{(i)})$ the position of electrode i. The chiplet dynamics becomes $$\mu \dot{x} = \nabla U(x),$$

where $\mu$ is the viscous coefficient, and $U(x)$ denotes the chiplet's potential energy. As is the 1D case, the potential energy is given by $$U(x) = \frac{1}{2}\Sigma_{i=1}^{N} C_i(x)[V_i - V(x)]^2,$$

where $V(x)$ denotes the chiplet electric potential, $C_i(x) = C(\|x - y^{(i)}\|)$ represents the capacitance between the chiplet and electrode i a position $y^{(i)}$, and $V_i$ represents the potential of electrode i. Similar to the 1D case, an assumption is made that the capacitance $C_i$ can be represented as the un-normalized discretization of a multivariable Gaussian pdf, that is:

$$C_i(X) \sim \int_{y_1(i)-\delta/2}^{y_1(i)+\delta/2} \int_{y_2(i)-\delta/2}^{y_2(i)+\delta/2} f(y|x) dy,$$

where $Y \sim \mathcal{N}(X, \sigma^2 I)$. The potential energy is similar to the 1D case and it is given by $U(x) = aE[(V(Y)-\bar{v}(X))^2|X=x]$.

Consider a set of chiplets $x_i(t)$, where each chiplet 11 behaves according to (5), that is $\dot{x}_i(t) = F(x_i(t))$, where $F(x) = \nabla_x U(x)$. An assumption is made that chiplet 11 to chiplet interactions 11 are negligible. The empirical distribution density associated to the solution $x(t)$ of (5) as is defined as:

$$f^N(x, t) = \frac{1}{N} \sum_{i=1}^{N} \delta(x - x_i(t)), \quad (6)$$

where $\delta$ is the Dirac delta function. An assumption is made that the chiplets 11 remain in a fixed, compact domain $x_i(t) \in \Omega \subset \mathbb{R}^2$ (e.g., the electrode array), for all N, and all $t \in [0, T]$. Hence, for all t, $f_t^N = f^N(\bullet, t)$ is a probability measure in $\mathcal{P}(\mathbb{R}^2)$ with uniform support in N. Therefore, according to Prohorov's theorem (described by Y. Prohorov. Convergence of random processes and limit theorems in probability theory. *Theory of Probability & Its Applications*, 1:157-214, 1956, the disclosure of which is incorporated b reference), there exits a subsequence $\{f^{N_k}\}_k$ and $f: \mathbb{R} \to \mathbb{R}^2$ such that $f^{N_k}$ converges pointwise to $f$, as k converges to infinity. Next, the evolution equation satisfied by the limit measure is derived. Let $\varphi: \mathbb{R}^2 \to \mathbb{R}$ be a smooth test function. Denoting by $<\bullet, \bullet>$ the inner product, what follows is:

$$\frac{d}{dt} < f_t^N,$$

$$\varphi > = \frac{1}{N} \sum_{i=1}^{N} \frac{d}{dt} \varphi(x_i(t)) = \frac{1}{N} \sum_{i=1}^{N} \frac{\partial \varphi}{\partial x}(x_i(t))\dot{x}_i(t) = \frac{1}{N} \sum_{i=1}^{N} < \nabla_x \varphi(x_i(t)),$$

$$F(x_i(t)) > = < f_t^N, \frac{\partial \varphi}{\partial x} F(x) >$$

By expending the time derivative of the left hand side of the previous equation, what follows is:

$$\frac{d}{dt} < f_t^N,$$

$$\varphi \geq < \frac{\partial f}{\partial x} F(x) + \frac{\partial f}{\partial t}, \varphi(x) > + < f_t^N,$$

$$\frac{\partial \varphi}{\partial x} F(x) > = < f_t^N, \frac{\partial \varphi}{\partial x} F(x) >$$

Accordingly, $$< \frac{\partial f^N}{\partial x} F(x) + \frac{\partial f^N}{\partial t}, \varphi(x) \geq 0.$$

For the limit $k \to \infty$ of the subsequence $f^{N_k}$, the dynamical equation governing the variation of the chiplet density over time is given by partial differential equation (PDE):

$$\frac{\partial f}{\partial x} F(x) + \frac{\partial f}{\partial t} = 0. \qquad (7)$$

The previous PDE of equation (7) is set by the capacity modeler 18 as the dynamic model 20 for controlling the chiplet density.

The one or more computing devices 16 further execute a position tracker 36 that analyzes the images 21 captured by the high-speed camera 15 (or data from another sensor) to estimate an existing (initial) density distribution 22 of the chiplets 11—how densely the chiplets 11 are distributed through various spatial regions within the enclosure. The position tracker 36 further receives (such as from a user) a desired, target density distribution 23—how densely the chiplets 11 should be distributed within different spatial regions within the disclosured. The current chiplet density distribution 22, the target density distribution 20, are used by an MPC optimizer 25 executed by one or more of the computing devices 16 to determine a control scheme 24, which includes control inputs 27—a sequence of electric potentials that need to be generated by the electrodes 12 induce the chiplets 11 to form the desired density. The determination is performed using model predictive control ("MPC") optimization by an MPC optimizer 25 executed by the one or more computing devices 16, such as described by Camponogara et al., "Distributed model predictive control," *Control Systems, IEEE*, 22(1):44-52, February 2002, and Garcia et al., "Model predictive control: Theory and practice—A survey," *Automatica*, 25(3):335-348, 1989, the disclosures of which are incorporated by reference, MPC is the go to approach for control of nonlinear systems and is based on solving a nonlinear program with constraints.

The one or more computing devices execute an MPC optimizer 25, which uses feedback control to shape an current density function (the initial density function describing the current density distribution 22 of the chiplets 11) $f_0(x) = f(x, 0)$ into a target density function $f_d(x)$, the target density function describing the target distribution 23 of the chiplets 11. The error between the current density function and the target one is expressed by using the Kullback-Leibler divergence, expressed as $$D_{KL}(f_t \| f_d) = \int_X f_t(x) \log\left(\frac{f_t(x)}{f_d(x)}\right) dx,$$

where $\mathcal{V} \subset \mathbb{R}^2$ is the domain of the density function. The objective of the MPC optimizer is to find a map for the potential assignments over time, such that the initial chiplet density 22 gets as close as possible to the target density distribution 23. The objective is to find a map V(x, t) that assigns over time electric potentials at every point $x \in \mathcal{X}$ and $t \in [0, T]$, with T some time horizon. By taking a model-predictive control approach, the ideal optimization problem that the MPC optimizer 25 would need to solve can be expressed as:

$$\min_{f(t,x), V(t,x) \in \mathcal{V}} \frac{1}{T} \int_{t=0}^{T} D_{KL}(f_t \| f_d) dt \qquad (8)$$

subject to:

$$\frac{\partial f}{\partial x} F(x, V) + \frac{\partial f}{\partial t} = 0, \forall t \in [0, T], f(0, x) = f_0(x), \forall x \in \mathcal{X}$$

$$f(x, t) \geq 0, \forall t \in \mathcal{T}, x \in \mathcal{X}, \int_X f(x, t) dx = 1, \forall t \in [0, T],$$

$$V(x, t) \in \mathcal{V}, \forall t \in \mathcal{T}, x \in \mathcal{X}$$

where $\mathcal{V} \subset \mathbb{R}$ is a compact set of possible electric potentials. The optimization problem simultaneously searches for a solution of the partial differential equation (7) and the potential assignment function V(t, x). The first two constraints 26 impose that $f(t, x)$ is a solution of (7), and that it is a density function. The last constraint 26 bounds the potential within some limits dictated by the power supply. In the current form, optimization problem of equation (8) is rather intractable. To make the optimization problem tractable, consider a discretization of both X, and time domain [0, T]. In particular, consider as set of points $\mathcal{X} = x_i$, $i \in 0, \ldots, n$, and $\bar{\mathcal{T}} = t_0, t_1, \ldots, t_N$. Equation (8) can be reformulated as follows:

$$\min_{f(t_i, x_j), V(t_i, x_j) \in \mathcal{V}} \frac{1}{N} \sum_{k=0}^{N} D_{KL}(f_{t_k} \| f_d) \qquad (9)$$

subject to:

$$\frac{\partial f}{\partial x}(x_j, t_i) F(x_j, V(x_j, t_i)) + \frac{\partial f}{\partial t}(x_j, t_i) = 0, \forall i, j$$

$$f(x_j, t_i) \geq 0, \forall i, j, \sum_{j=1}^{n} f(x_j, t_i) = 1, \forall i,$$

$$V(x_j, t_i) \in \mathcal{V}, \forall i, j$$

and where we the continuous version of the density divergence with the density divergence's discrete version, namely $$D_{KL} = \sum_{j=1}^{n} f(x_j, t) \log\left(\frac{f(x_j, t)}{f_d(x_j)}\right).$$

An additional challenge exists: evaluate the force $F(x(t)) = \nabla_x U(x(t), V(x, t))$. To compute the gradient of the potential function, an automatic differentiation feature of a deep learning platform is leveraged, such as described in James Bradbury et al. JAX: composable transformations of Python+NumPy programs, 2018; Martin Abadi et al. TensorFlow: Large-scale machine learning on heterogeneous systems, 2015, software available from tensorflow.org; Adam Paszke, Sam Gross, Soumith Chintala, Gregory Chanan, Edward Yang, Zachary DeVito, Zeming Lin, Alban Desmaison, Luca Antiga, and Adam Lerer. Automatic differentiation in pytorch. 2017, the disclosures of which are incorporated by reference.

To compute the potential function, the MPC optimizer 25 needs to evaluate the variance of multi-variate, Gaussian conditional distribution, namely $U(x) = aE[(V(Y) - \bar{v}(X))^2 | X=x]$, where $\bar{v}(x) = E[V(Y) | X=x]$, and $Y | X \sim \mathcal{N}(X, \sigma^2 I)$, with $\sigma$ a parameter determined from the geometric properties of the spherical assumed chiplet. To address this challenge, the MPC optimizer 25 makes use of Gauss-Hermite quadrature rules, such as described in Gene H. Golub and John H. Welsch. Calculation of gauss quadrature rules. Technical report, Stanford, CA, USA, 1967, the disclosure of which is incorporated by reference. Gauss-Hermite quadrature rules often found in the theory of generalized chaos polynomials (GPC), such as described by Anthony O'Hagan. Polynomial chaos: A tutorial and critique from a statistician's perspective. Technical report, University of Sheffield, UK, may 2013; Ralph C. Smith. *Uncertainty Quantification: Theory, Implementation, and Applications*. Society for Industrial and Applied Mathematics, Philadelphia, PA, USA, 2013; Norbert Wiener. The Homogeneous Chaos. *American Journal of Mathematics*, 60(4): 897-936, 1938; Dongbin Xiu, Didier Lucor, C.-H. Su, and George Em Karniadakis. Performance evaluation of generalized polynomial chaos. In *Computational Science—ICCS 2003: International Conference*, Melbourne, Australia and St. Petersburg, Russia, Jun. 2-4, 2003 *Proceedings, Part IV*, pages 346-354, Berlin, Heidelberg, 2003. Springer Berlin Heidelberg, the disclosures of which are incorporated by reference. Gauss-Hermite quadrature rules provide the tool to efficiently evaluate the conditional expectations. Accordingly, the expectation of a function of a random variable with a Gaussian distribution, can be accurately approximated using Gauss-Hermite quadrature. Since the conditional probability distribution of Y|X can be expressed as product of two Gaussian distribution $y_i|x_i \sim \mathcal{N}(x_i, \sigma^2)$, with $i \in 1, 2$ we have that the expectation of V(Y) is given by $$\bar{v}(x) = \qquad (10)$$
$$E[V(Y)|X=x] \approx \frac{1}{\pi} \sum_{i,j=1}^{n} w_i w_j V(\sqrt{2}\,\sigma y_i + x_1, \sqrt{2}\,\sigma y_j + x_2),$$

where n is the number of sample points, $y_i$ are the roots of the physicists' version of the Hermite polynomial $H_n(y)$ and $w_i$ are associated weights given by $$w_i = \frac{2^{n-1} n! \sqrt{\pi}}{n^2 [H_{n-1}(y_i)]^2}.$$

Similarly, the variance of V(Y) can be approximated as $$U(x) = E[(V(Y) - \bar{v}(X))^2 | X = x] \approx \qquad (11)$$
$$\frac{1}{\pi} \sum_{i,j=1}^{n} w_i w_j \big[V(\sqrt{2}\,\sigma y_i + x_1, \sqrt{2}\,\sigma y_j + x_2) - \bar{v}(x)\big]^2$$

The last step in the effort to arrive at a tractable optimization formulation is to parameterize both the solution $f(x, t)$ of the PDE of equation (7) and the potential allocation map V(x, t). Namely, two smooth functions $f(x, t) = f(t, x; \theta_f)$ and $V(x, t) = V(x, t; \theta_v)$. Denoting the combined parametrization by $\theta^T = (\theta_f^T, \theta_v^T)$, the final form of the optimization formulation to be performed by the MPC optimizer is as follows:

$$\min_{\theta} \frac{1}{N} \sum_{k=0}^{N} D_{KL}(f_{t_k} \| f_d) \qquad (12)$$

subject to:

$$\frac{\partial f}{\partial x}(x_j, t_i; \theta) F(x_j, V(x_j, t_i; \theta)) + \frac{\partial f}{\partial t}(x_j, t_i; \theta) = 0, \forall i, j$$

$$f(x_j, t_i; \theta) \geq 0, \forall i, j, \sum_{j=1}^{n} f(x_j, t_i; \theta) = 1, \forall i,$$

$$V(x_j, t_i; \theta) \in \mathcal{V}, \forall i, j$$

The MPC optimizer can solve a proxy of the optimization of equation (12), in which the PDE constraint and the initial value boundary condition are treated as weighted cost functions. In particular, three lost functions are defined:

$$\mathcal{L}_1(\theta) = \frac{1}{N} \sum_{k=0}^{N} D_{KL}(f_{t_k} \| f_d) \qquad (13)$$

$$\mathcal{L}_2(\theta) = \sum_{i,j} \left[\frac{\partial f}{\partial x}(x_j, t_i; \theta) F(x_j, V(x_j, t_i; \theta)) + \frac{\partial f}{\partial t}(x_j, t_i; \theta)\right]^2 \qquad (14)$$

$$\mathcal{L}_3(\theta) = D_{KL}(f(., 0) \| f_0) \qquad (15)$$

and the overall loss function is defined as $\mathcal{L}(\theta) = \alpha_1 \mathcal{L}_1(\theta) + \alpha_2 \mathcal{L}_2(\theta) + \alpha_3 \mathcal{L}_3(\theta)$, where $\alpha_1, \alpha_2, \alpha_3$ are non-negative scalars that assign different weights to the three loss functions. The density constraint is imposed by definition. In particular, given a function $g: R \times R^2 \to R$ that depends on $\theta$, the density function is parametrized as follows:

$$f(x_i, t; \theta) = \frac{g(x_i, t; \theta)^2}{\sum_j g(x_j, t; \theta)^2}, \forall t, i.$$

Box type of constraints 26 are considered for the function $V(x, t; \beta)$, that is, $\mathcal{V} = [V_{min}, V_{max}]$, and the potential allocation function is defined as:

$$V(x, t; \theta) = \min(\max(\tilde{V}(x, t; \theta), V_{min}), V_{max}),$$

for some smooth function $\tilde{V}: R \times R^2 \to R$. Therefore, in practice, the MPC optimizes 25 solves the following optimization problem:

$$\min_{\theta} \mathcal{L}(\theta) \qquad (16)$$

There are four derivatives/gradients that need to be evaluated while solving the optimization problem of equation (16):

$$\frac{\partial f}{\partial t}, \frac{\partial f}{\partial x}, \nabla_x U, \text{ and } \nabla_\theta \mathcal{L}.$$

In one embodiment, the MPC Optimizer 25 can leverage the JAX Python platform, as described by James Bradbury et al. JAX: composable transformations of Python+NumPy programs, 2018, the disclosure of which is incorporated by reference, which can automatically differentiate native Python and NumPy functions, though in a further embodiment, other kinds of software platforms can be leveraged. In solving the optimization problem, The MPC optimizer 25 performs the Adam gradient based optimization algorithm which is integrated with the JAX platform that features automatic differentiation, as described by] Diederik P. Kingma and Jimmy Ba. Adam: A method for stochastic optimization, 2014. cite arxiv:1412.6980Comment: Published as a conference paper at the 3rd International Conference for Learning Representations, San Diego, 2015, the disclosure of which is incorporated by reference. JAX is a Python package that implements automatic differentiation and additional information about which can be found at https://jax.readthedocs.io/en/latest/, the disclosure of which is incorporated by reference. Thus, the MPC optimizer 25 can leverage machine learning algorithms, including automatic differentiation, to obtain the control inputs 27, the sequence of electrode potentiations that will allow to minimize the difference between the existing chiplet density distribution 22 and the target chiplet density distribution 23.

The control inputs 27 generated by the MPC optimizer are used by a projector controller 28 executed by the one or more computing devices 16 to map the control inputs 27 to the images 37 that are provided to the video projector 14, and which in turn projects the images 37 to the photo-transistors controlling the electrodes 11, thus actuating the electrodes 12 to induce the movement of the chiplets 11. The mapping can be done as described in U.S. Patent Application Publication No. US20200207617, entitled "Micro-assembler system for manipulating micro-objects," to Plochowietz et al., published Jul. 2, 2020, the disclosure of which is incorporated by reference.

In a further embodiment, to increase scalability of the processing, a potential allocation map necessary to achieve a desired chiplet density could be derived as a function of the current chiplet distribution instead of using MPC optimization.

Once a desired density distribution has been achieved, individual particles could be moved using the system, as described in U.S. patent application Ser. No. 17/121,411, filed Dec. 14, 2020, entitled System and Method for Machine-Learning Enabled Micro-Assembly Control With the Aid of a Digital Computer, to Matei et al., the disclosure of which is incorporated by reference.

Figure 9:
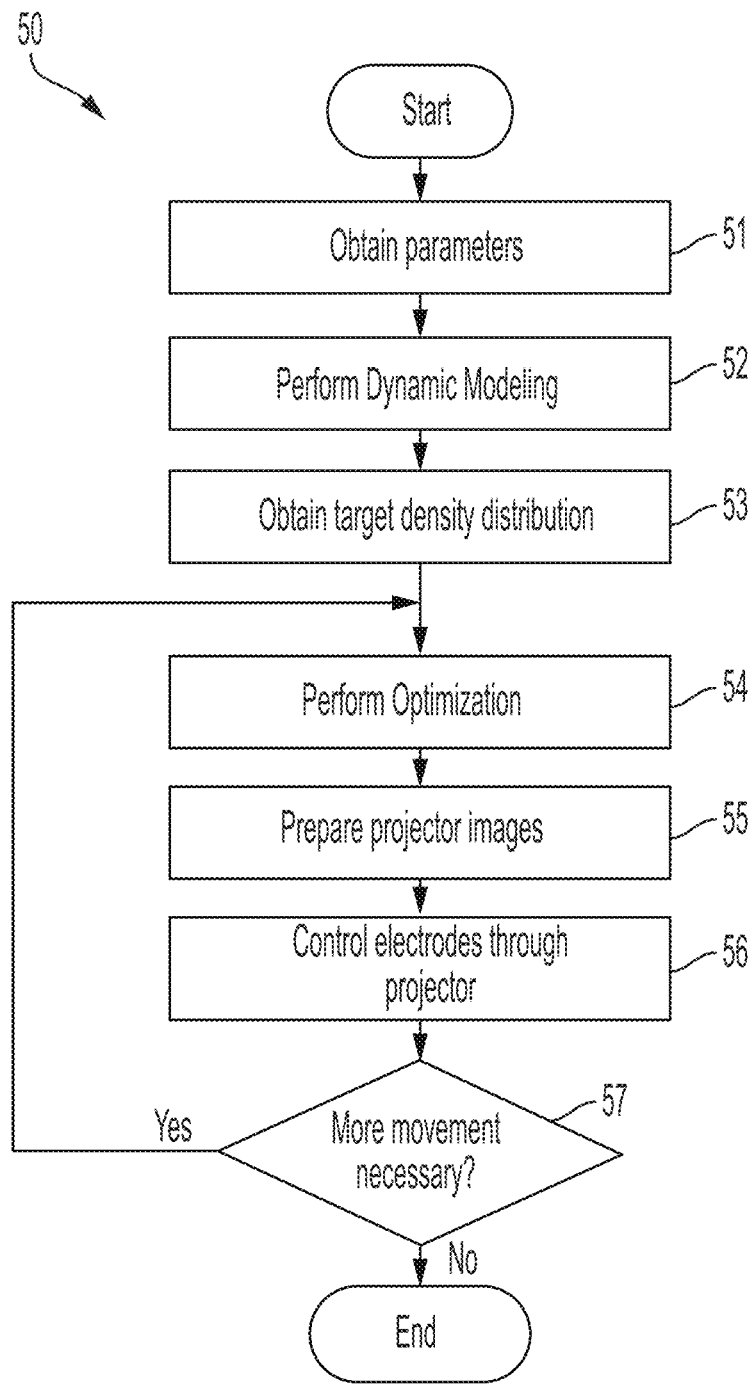
FIG. 9 is a flow diagram showing a method for machine-learning-enabled micro-object density distribution control with the aid of a digital computer.

Using model predictive control to compute a sequence of electric potential allocations that shape the chiplet distribution into a desired pattern allows to achieve a desired chiplet distribution pattern in a computationally-efficient way. Further, using Gauss-Hermite quadratures to accurately approximate expectations, and automatic differentiation to compute derivatives of physical quantities (e.g., potential energy, chiplet distribution) and the gradient of the KL loss function provides additional tractability to the approach. FIG. 9 is a flow diagram showing a method 50 for machine-learning-enabled micro-object density distribution control with the aid of a digital computer. The method 50 can be performed using the system of FIG. 2. Parameters of the system are obtained, such as diameter of the chiplets, the dimensions of the electrodes, the dielectric fluid constant, the initial chiplet density distribution (which can be obtained using the high-speed camera), and material of the chiplets and electrodes, and the height of the chiplets, though other parameters are possible (step 51). A dynamic model governing the variation of the chiplet density over time is set (step 52), as further described below with reference to FIG. 10 and as described above with reference to FIG. 1. Target density distribution of the chiplets is received (step 53). MPC optimization to derive control inputs, a sequence of electrode potentials that would minimize difference between the current chiplet density distribution and target chiplet density distribution are obtained, as further described above with reference to FIG. 1 (step 54). The control inputs are mapped to images for display by the video projector (step 55) and electrodes in the electrode array are controlled to induce the movement of the chiplets to desired positions (step 56). If the desired density distribution has been achieved (as can be observed using the camera 15) and no further chiplet movement is necessary, the method 50 ends. If the target density distribution has not been achieved and the chiplets still need to be moved (step 57), the method 50 returns to step 54.

As mentioned above, in a further embodiment, at least one sensor other than the high-speed camera could be used to estimate density distribution. Likewise, in a further embodiment, other ways to actuate the programmable electrodes besides the photo-transistor array are possible. In these further embodiments, the method 50 would be amended accordingly.

Figure 10:
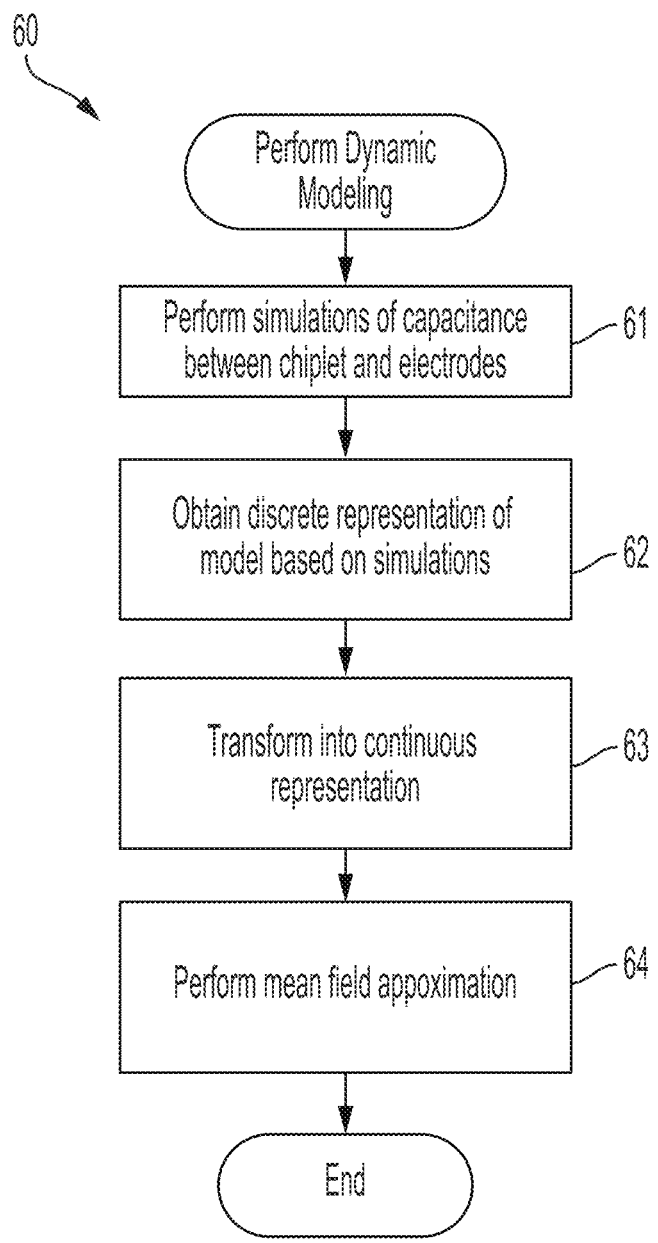
FIG. 10 is a flow diagram showing a routine for setting for the dynamical model governing the variation of the chiplet density over time for use in the method of FIG. 9 in accordance to one embodiment.
Figure 11A:
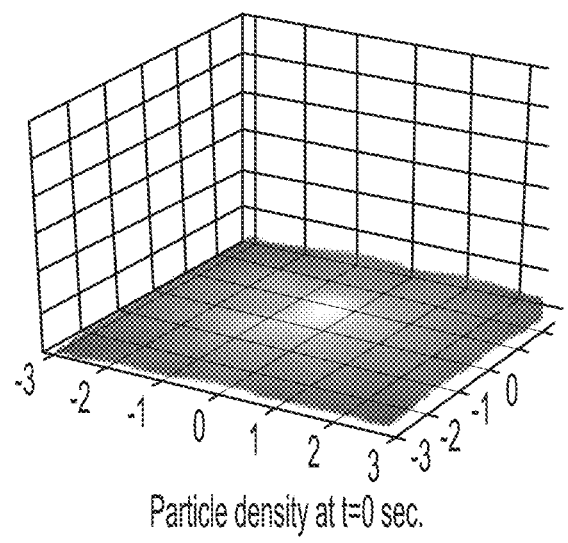
FIGS. 11A-11F are diagrams showing the chiplet density distributions of the first example at different time instants.
Figure 11B:
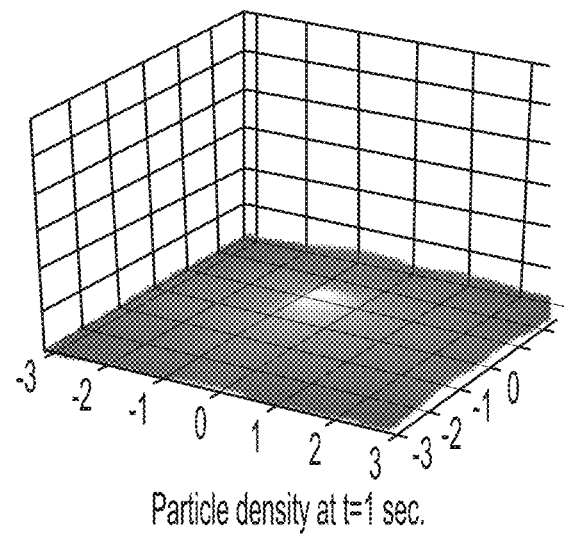
Figure 11C:
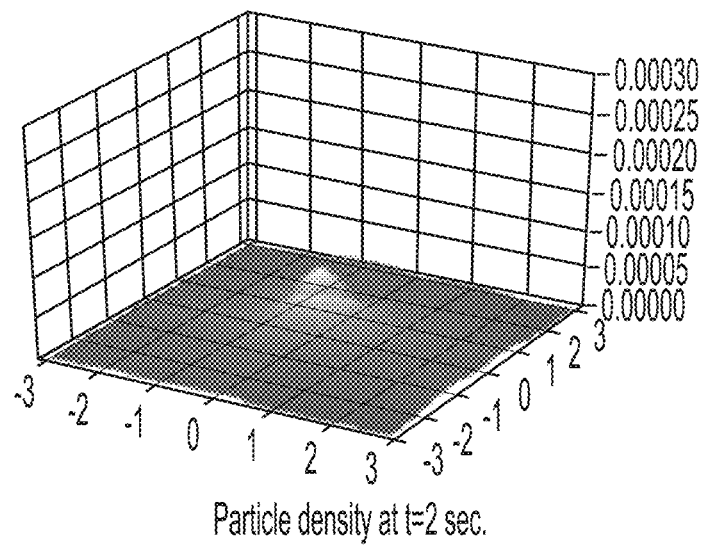
Figure 11D:
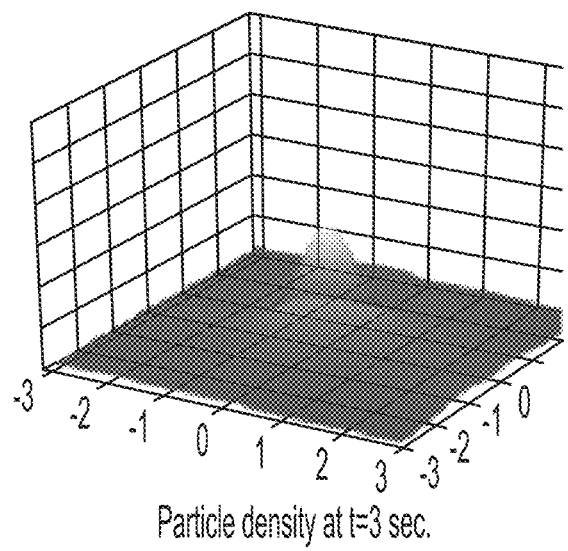
Figure 11E:
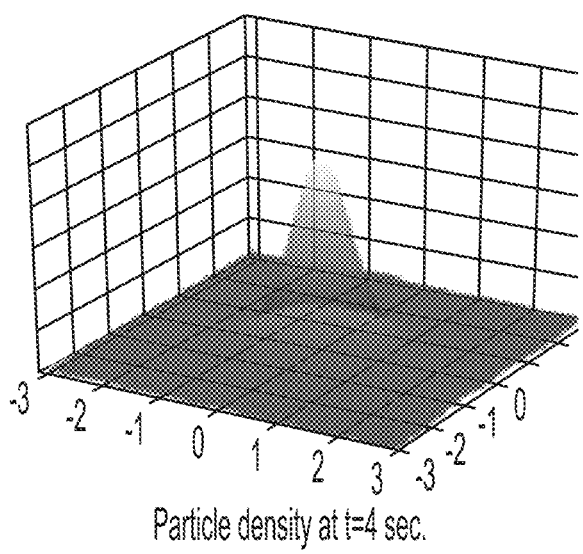
Figure 11F:
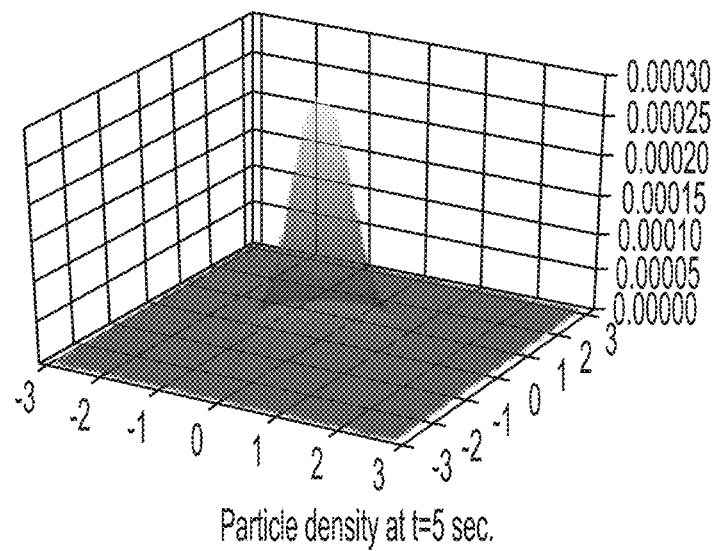
Figure 12A:
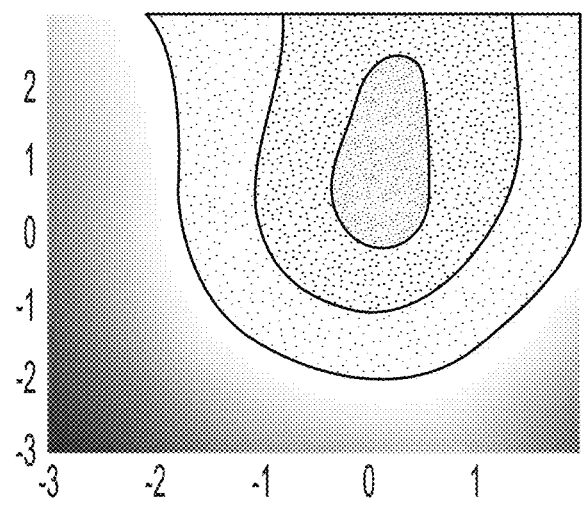
FIGS. 12A-12F show the evolution of the electric potential of the electrodes over time to create the chiplet density distributions of FIGS. 11A-11F.
Figure 12B:
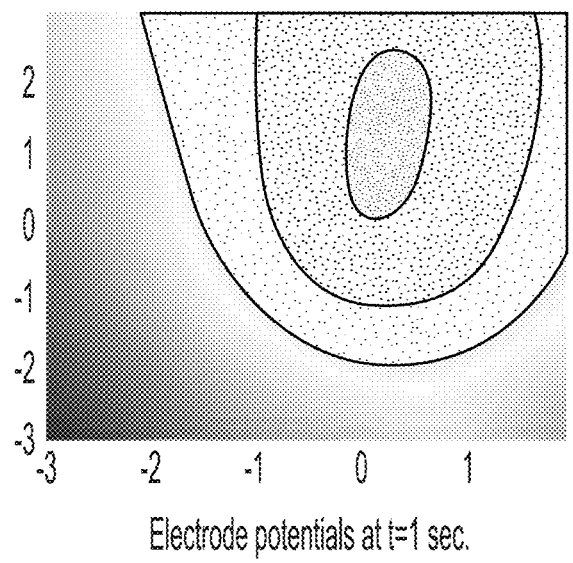
Figure 12C:
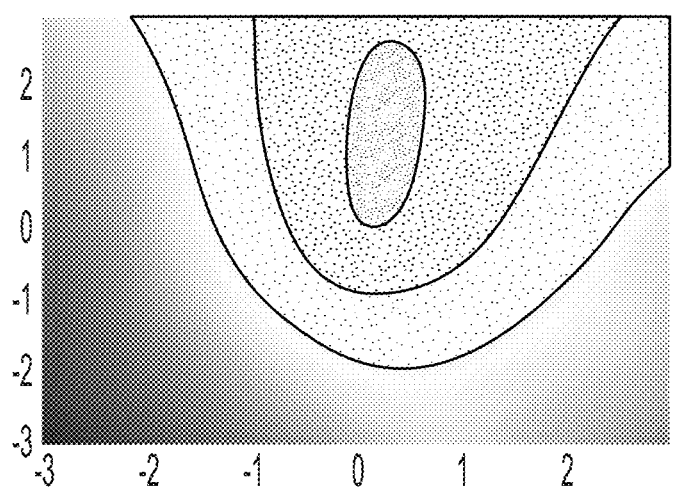
Figure 12D:
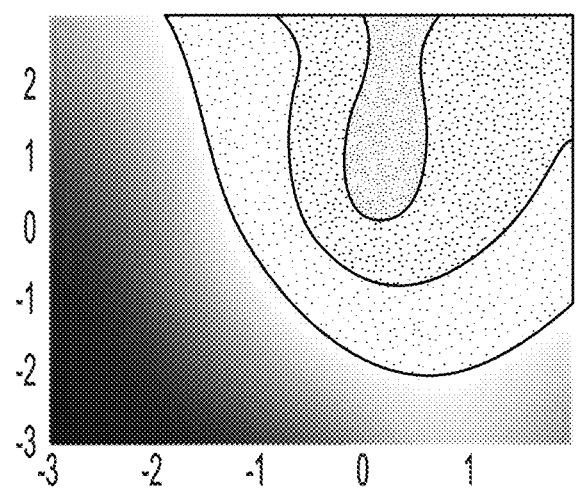
Figure 12E:
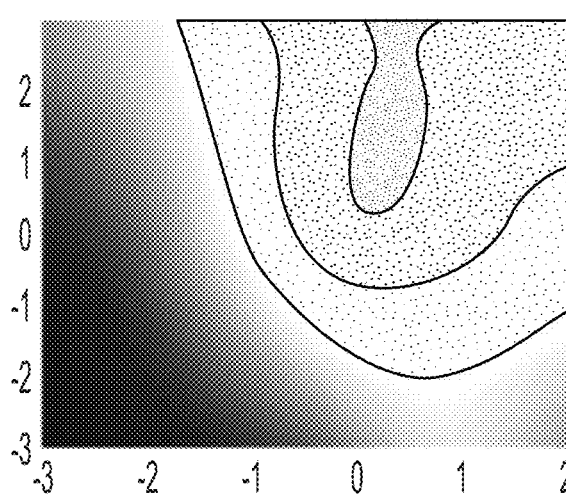
Figure 12F:
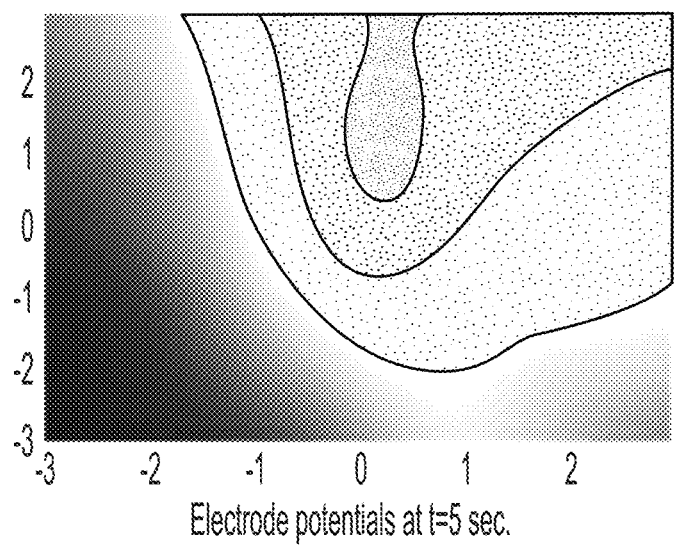
Figure 13A:
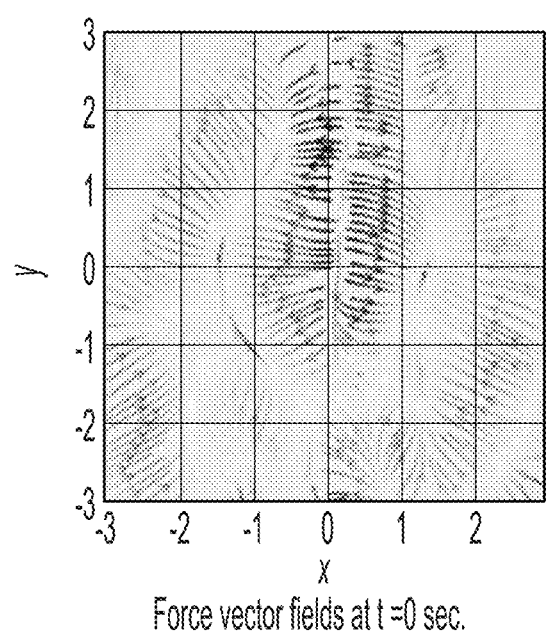
FIGS. 13A-13F are diagram illustrating force vector fields over time used to create the chiplet density distributions of FIGS. 11A-11F.
Figure 13B:
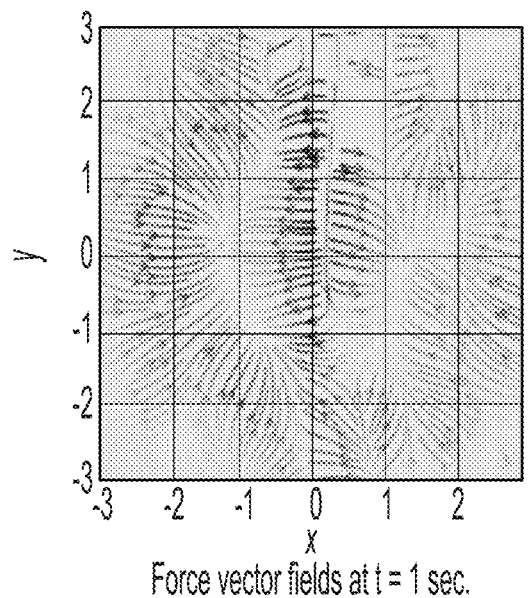
Figure 13C:
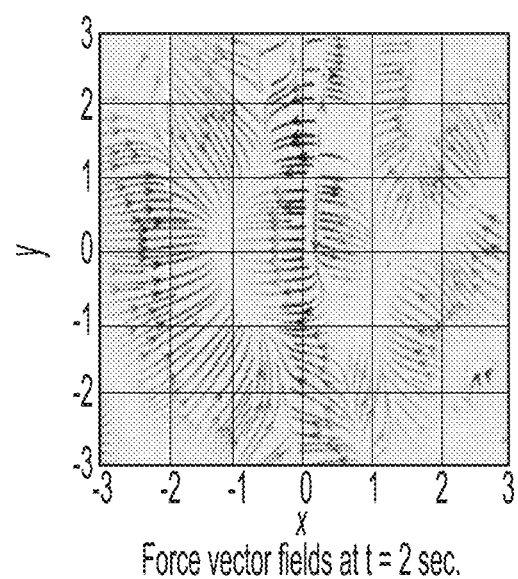
Figure 13D:
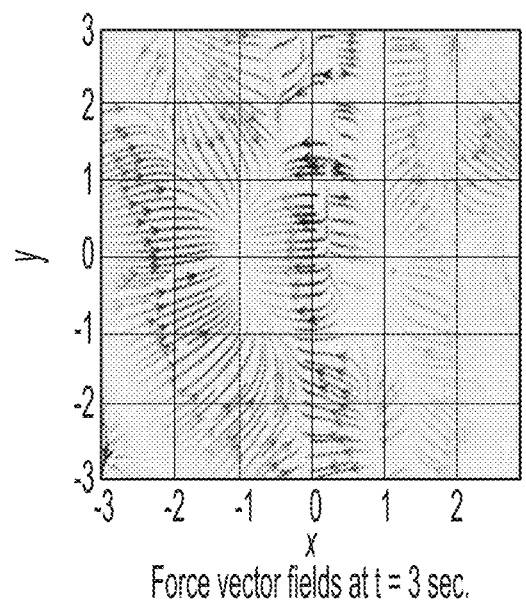
Figure 13E:
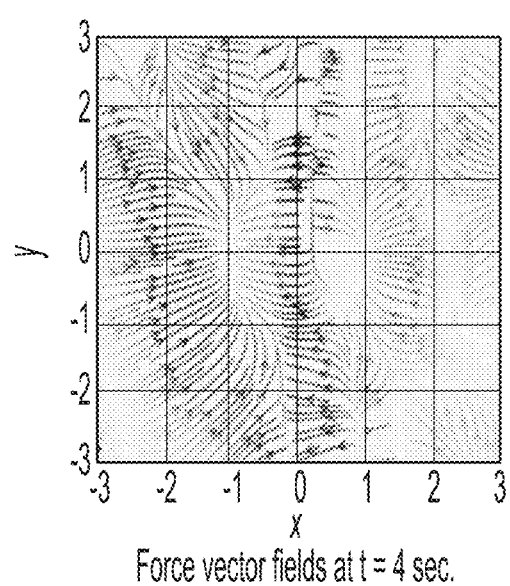
Figure 13F:
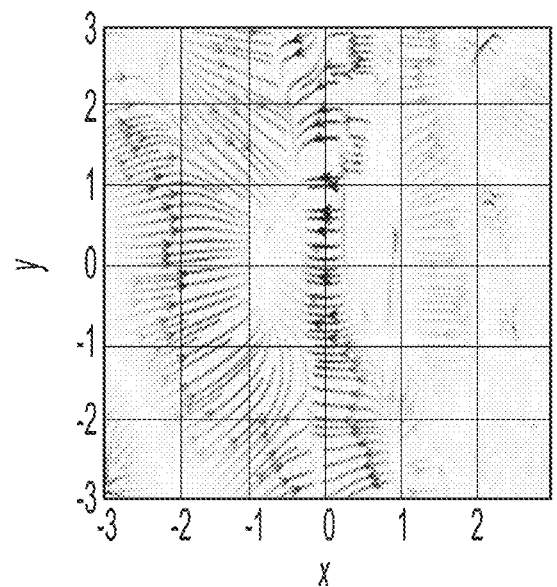
Figure 14A:
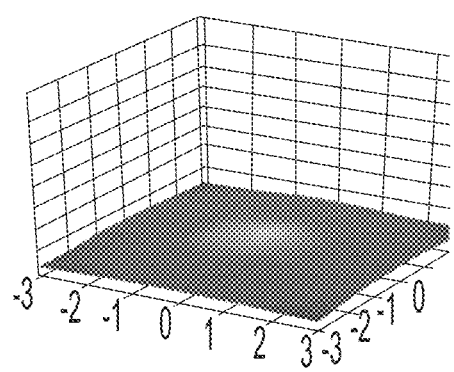
FIGS. 14A-14F are diagrams showing the chiplet density distributions of the second example at different time instants.
Figure 14B:
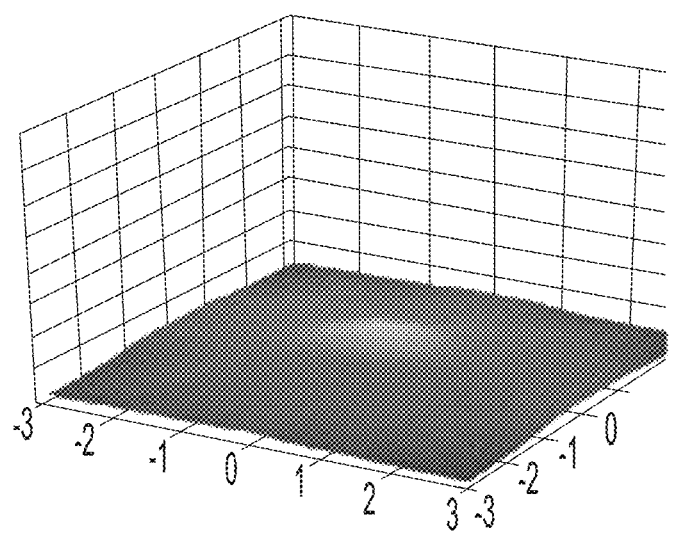
Figure 14C:
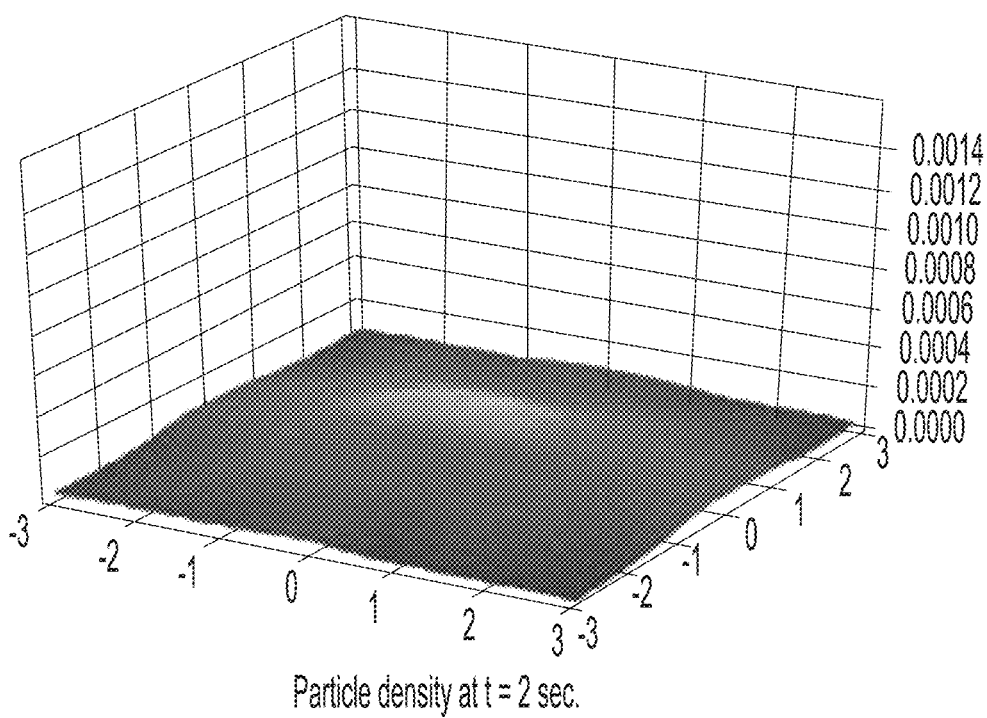
Figure 14D:
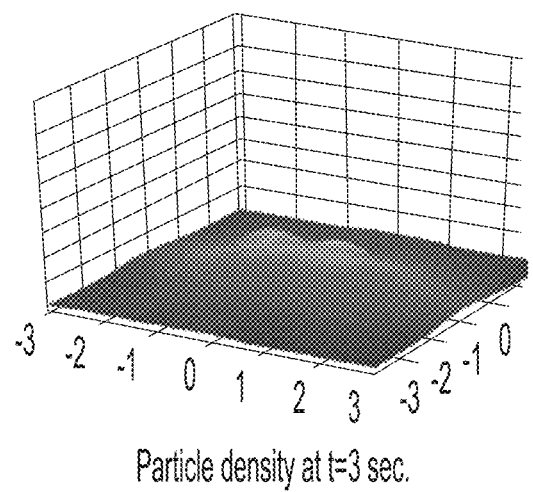
Figure 14E:
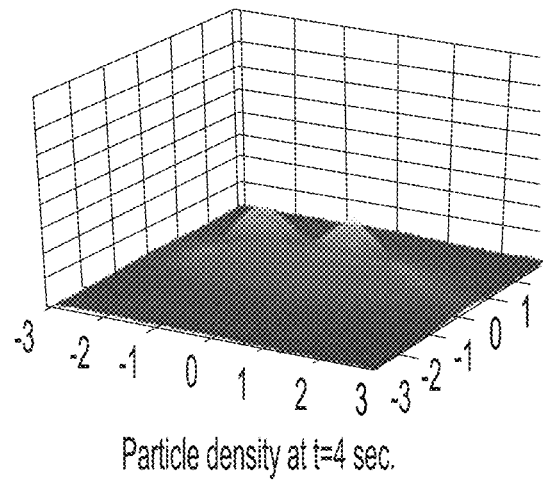
Figure 14F:
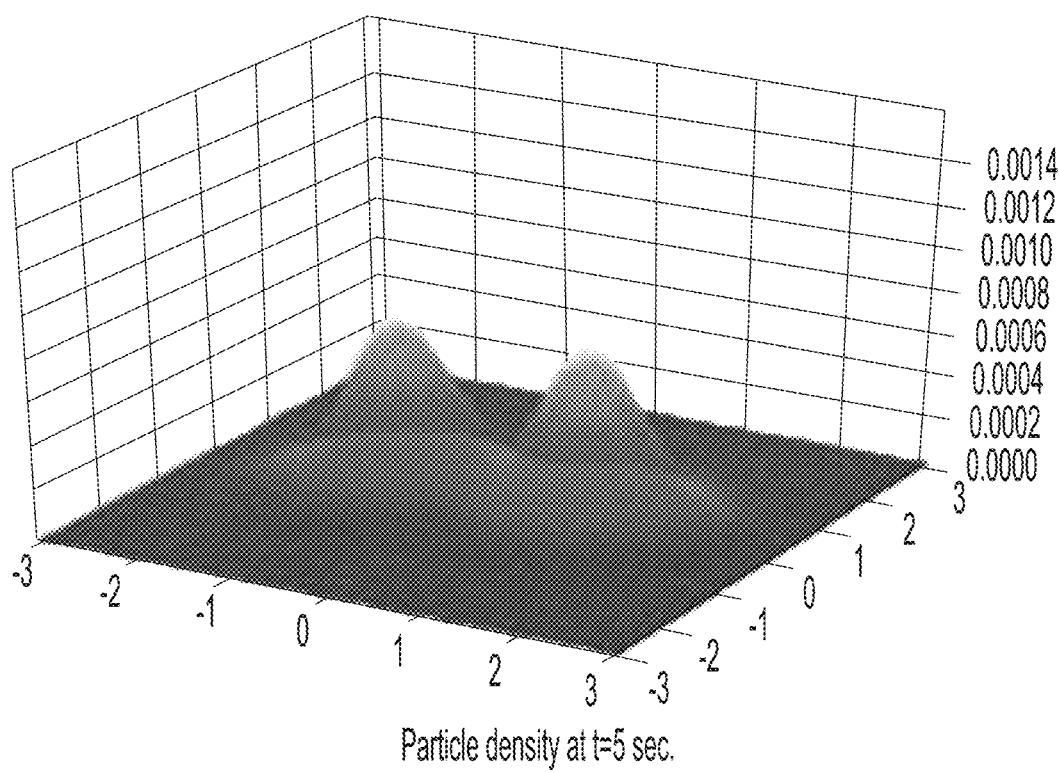
Figure 15A:
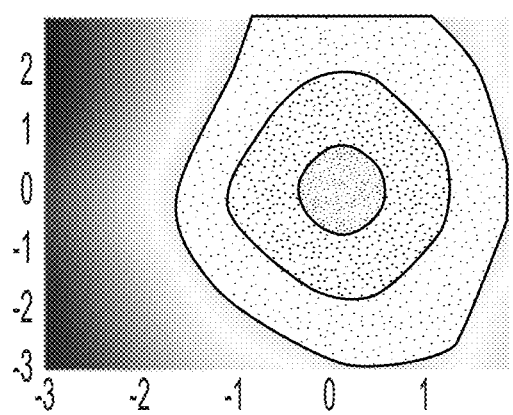
FIGS. 15A-15F show the evolution of the electric potential of the electrodes over time to create the chiplet density distributions of FIGS. 14A-14F.
Figure 15B:
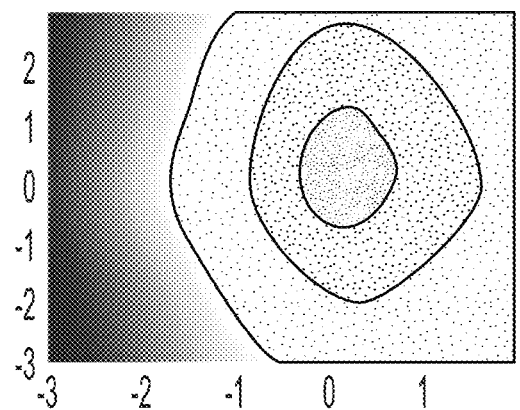
Figure 15C:
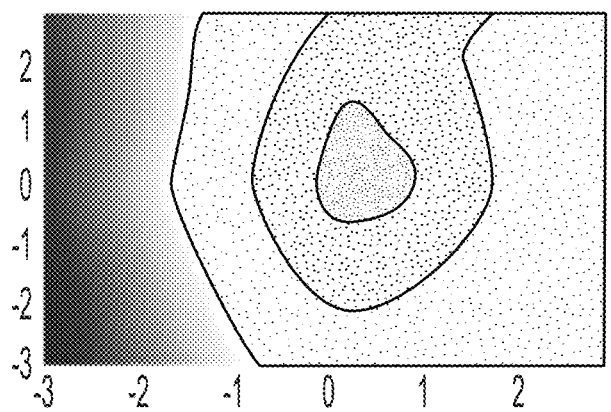
Figure 15D:
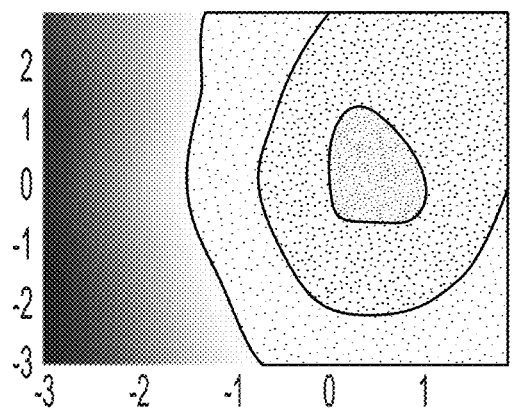
Figure 15E:
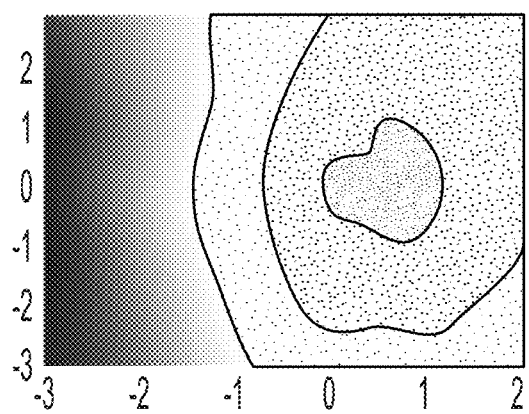
Figure 15F:
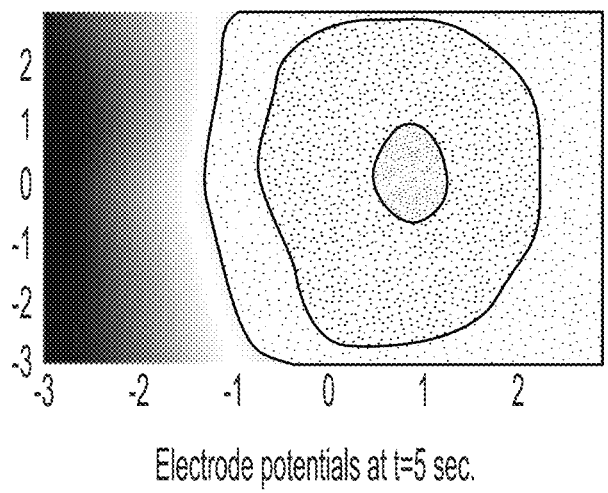
Figure 16A:
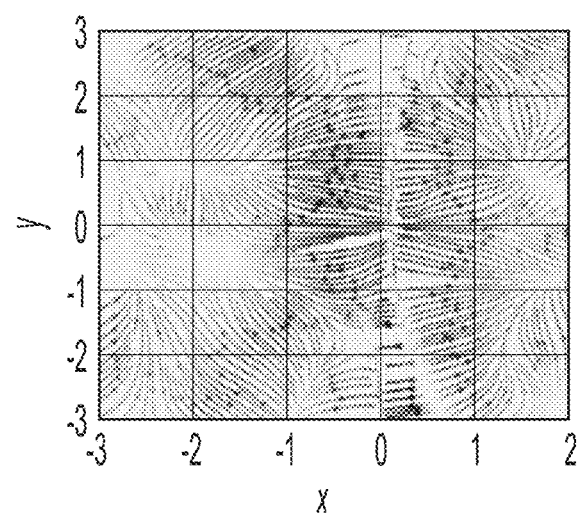
FIGS. 16A-16F are diagram illustrating force vector fields over time used to create the chiplet density distributions of FIGS. 14A-14F.
Figure 16B:
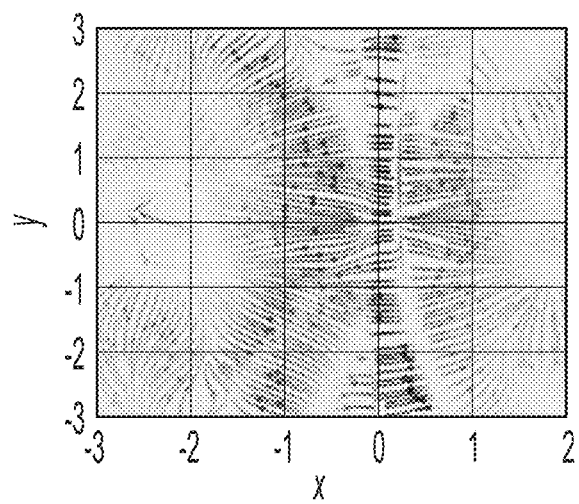
Figure 16C:
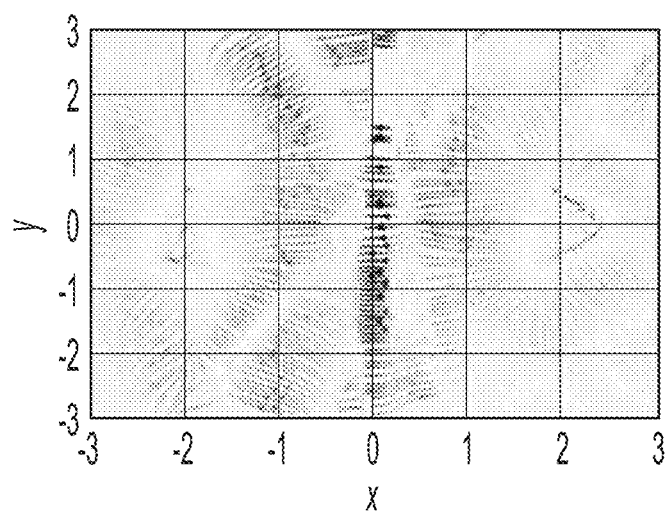
Figure 16D:
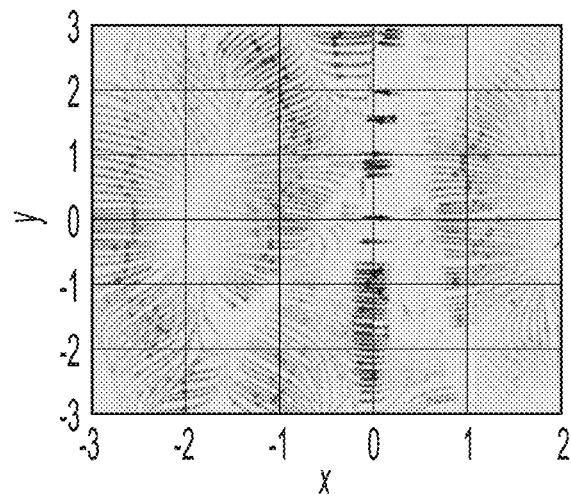
Figure 16E:
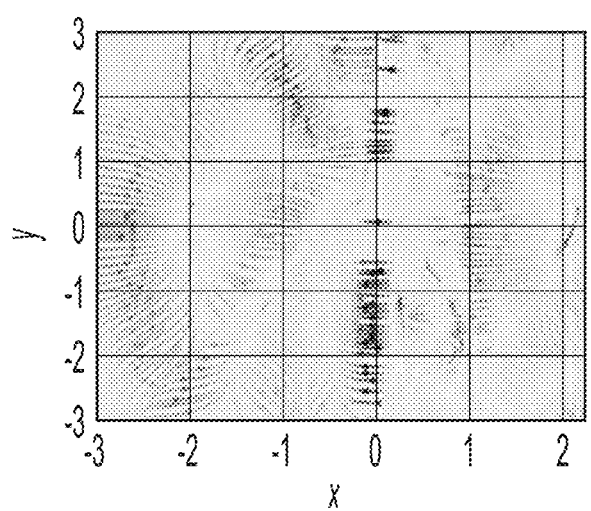
Figure 16F:
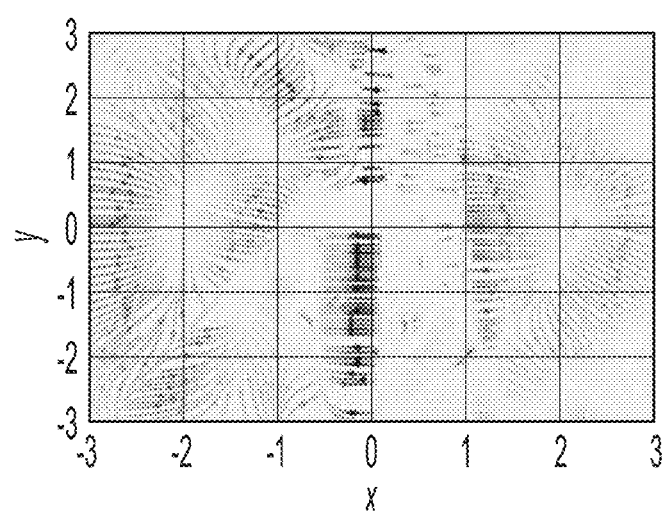

The capacitance-based model for dynamic control over chiplet density can be derived through use of mean field approximation. FIG. 10 is a flow diagram showing a routine 60 setting for the dynamical model governing the variation of the chiplet density over time for use in the method 50 of FIG. 9 in accordance to one embodiment. Simulations, such as COMSOL simulations, are performed for capacitance between an electrode and a chiplet at multiple distances as described above with reference to FIG. 1 (step 61). A discrete representation of a model for moving one of the chiplets based on capacitance between the chiplet and the electrodes is defined based on the simulations, as described above with reference to FIG. 1 (step 62). The discrete representation of the model is transformed into a continuous representation as described above with reference to FIG. 1 (step 63). Mean field approximation is applied to the continuous representation of the model for dynamic control over chiplet density (step 64), ending the routine 60.

For purposes of illustration and not limitation, two experimental examples of use of the system and method described above to manipulate chiplet density distributions are provided. In the examples, a normalized representations of quantities of chiplet positions on the electrode grid and electric potentials. They are similar to the their physical counterparts up a scaling factor. A 3×3 grid was used, with a sampling period of 0.025. The chiplet capacitance is a multivariate, Gaussian distribution with mean and the chiplet position x and covariance matrix $\sigma^2 I$, where $\sigma=0.05$. A time horizon of 5 seconds was considered and a sampling period of 0.1 sec. The PDE solution $f(x, t)$ and the potential allocation function $V(x, t)$ was modeled as neural networks with one hidden layer of size 30 and tan h as activation function. Each function has input of size 3 and output of size 1. The step-size for the Adam optimization algorithm was 0.001. The number of epochs was varied based on the quality of the solutions. 30 points were used to approximate the expectations in equations (10) and (11) (with the points being denoted by the term "n" in those equations) by using the Gauss-Hermite quadrature, which results in a total of 30×30 points.

In the first example of chiplet density distribution change achieved using the system of FIG. 2 and the method of FIG. 9, the objective is to start with a "flat" distribution of chiplets 11 and to generate a sequence of potential allocations that concentrate the chiplet near the origin. The initial distribution is a 2-dimensional Gaussian distribution, with zero mean and covariance matrix $\sigma^2 I$, with $\sigma=2$. FIGS. 11A-11F are diagrams showing the chiplet density distributions of the first example at different time instants. The chiplet distribution starts start at t=0 sec with an almost flat distribution and achieve the desired distribution at t=5 sec. FIGS. 12A-12F show the evolution of the electric potential of the electrodes over time to create the chiplet density distributions of FIGS. 11A-11F. Grayscale portions of the FIG. 12A-12F refer to low electrode potential values—the darker the grayscale colors in a portion of the figure, the smaller the potentials being in that portion of the figure. Stippled portions of the FIGS. 12A-12F refer to high electric potential values—the denser the stippling in a portion of the figure, the larger the potential value in that portion of the figure is. In FIGS. 12A-12F, the x and y axes are the first (x1) and the second (x2). The evolution of the force vector field is shown with reference to FIGS. 13A-13F. FIGS. 13A-13F are diagram illustrating force vector fields over time used to create the chiplet density distributions of FIGS. 11A-11F. In FIGS. 13A-13F, the arrow at a point indicates the direction in which chiplet at that point is pushed and color intensity is proportional to the force magnitude.

In the second example of chiplet density distribution change achieved using the system of FIG. 2 and the method of FIG. 9, the chiplets were split into two piles. The example starts with a zero mean, Gaussian distribution covariance matrix $\sigma^2 I$ with $\sigma=2$, and two separate piles were created. The final distribution is a mixture of two Gaussian distributions, where the two distributions are centered at $\mu_1^T=[-1,0]$ and $\mu_2^T=[1,0]$, respectively. Both distributions have the covariance matrix al with $\sigma=0.5$. FIGS. 14A-14F show the evolution over time of the chiplet distribution. FIGS. 14A-14F are diagrams showing the chiplet density distributions of the second example at different time instants. At t=5 sec, the desired separation of chiplets was achieved. FIGS. 15A-15F show the evolution of the electric potential of the electrodes over time to create the chiplet density distributions of FIGS. 14A-14F. Grayscale portions of the FIG. 15A-15F refer to low electrode potential values—the darker the grayscale colors in a portion of the figure, the smaller the potentials being in that portion of the figure. Stippled portions of the FIGS. 15A-15F refer to high electric potential values—the denser the stippling in a portion of the figure, the larger the potential value in that portion of the figure is. In FIGS. 15A-15F, the x and y axes are the first (x1) and the second (x2). FIGS. 16A-16F are diagram illustrating force vector fields over time used to create the chiplet density distributions of FIGS. 14A-14F. In FIGS. 16A-16F, the arrow at a point indicates the direction in which chiplet at that point is pushed and color intensity is proportional to the force magnitude. FIGS. 16A-16F confirm the intuition on how the field should look like. At t=0 sec, there are forces pushing outward from the center. As the chiplets reach their final distribution, the forces surround the two areas, pushing inwards.

While the invention has been particularly shown and described as referenced to the embodiments thereof, those skilled in the art will understand that the foregoing and other changes in form and detail may be made therein without departing from the spirit and scope of the invention.

What is claimed is:

1. A system for micro-object density distribution control with the aid of a digital computer, comprising:
    one or more processors configured to execute computer-executable code, the processors configured to:
        obtain one or more parameters of a system for positioning a plurality of micro-objects, the system comprising a plurality of programmable electrodes, the electrodes configured to induce a movement of the micro-objects when the micro-objects are proximate to the electrodes upon a generation of one or more electric potentials by one or more of the electrodes;
        define a model describing a variation of micro-object density over time due to capacitance-based interactions based on the parameters of the system;
        estimate a density distribution of the micro-objects using at least one sensor;
        receive a target density distribution of the micro-objects;
        perform model predictive control (MPC) optimization to derive based on the density model a sequence of the electrode potentials to be generated by at least some of the electrodes for moving at least some of the micro-objects to minimize an error between the estimated density distribution and the target density distribution;
        actuate at least some of the electrodes to generate the sequence of the electrode potentials.

2. A system according to claim 1, further comprising:
    define a discrete representation of a model for moving of one of the micro-objects based on the parameters;
    transform the discrete representation of the movement model into a continuous representation; and
    apply mean field approximation to the continuous representation of the model to obtain the density model.

3. A system according to claim 2, further comprising:
    perform a plurality of simulations of the capacitance between the electrodes and one of the micro-objects; and
    define a function comprised in the movement model and describing the capacitance between the micro-object and each of the electrodes as a function of a distance between that micro-object and that electrode.

4. A system according to claim 3, wherein the movement model describes the movement in at least one of one dimension and two dimensions.

5. A system according to claim 1, wherein the error between the estimated density distribution and the target density distribution is expressed using Kullback-Leibler divergence.

6. A system according to claim 1, wherein performing the MPC optimization comprises performing automatic differentiation to compute a plurality of gradients.

7. A system according to claim 1, wherein performing the MPC optimization comprises evaluating at least one expectation using Gauss-Hermite quadrature.

8. A system according to claim 1, wherein the processors comprise at least one of one or more graphics processing units (GPUs) and one or more of tensor processing units (TPUs).

9. A system according to claim 8, wherein two or more of the processors work in parallel to perform the MPC optimization.

10. A system according to claim 1, wherein the electrodes are controlled by photo-transistors, the one or more processors further configured to:
    map the electrode potentials in the sequence to a plurality of images;
    control a video projector to project the images to the photo-transistors, wherein the phototransistors control the electrodes to generate the sequence of the electrode potentials based on the projected images.

11. A method for micro-object density distribution control with the aid of a digital computer, comprising:
    obtaining, by one or more processors configured to execute computer-executable code, one or more parameters of a system for positioning a plurality of micro-objects, the system comprising a plurality of programmable electrodes, the electrodes configured to induce a movement of the micro-objects when the micro-objects are proximate to the electrodes upon a generation of one or more electric potentials by one or more of the electrodes;

defining by one or more of the processors, a model describing a variation of micro-object density over time due to capacitance-based interactions based on the parameters of the system;

estimating by one or more of the processors a density distribution of the micro-objects using at least one sensor;

receiving by one or more of the processors a target density distribution of the micro-objects;

performing by one or more of the processors model predictive control (MPC) optimization to derive based on the density model a sequence of the electrode potentials to be generated by at least some of the electrodes for moving at least some of the micro-objects to minimize an error between the estimated density distribution and the target density distribution;

actuating by one or more of the processors at least some of the electrodes to generate the sequence of the electrode potentials.

12. A method according to claim 11, further comprising:
defining a discrete representation of a model for moving of one of the micro-objects based on the parameters;
transforming the discrete representation of the movement model into a continuous representation; and
applying mean field approximation to the continuous representation of the model to obtain the density model.

13. A method according to claim 12, further comprising:
performing a plurality of simulations of the capacitance between the electrodes and one of the micro-objects; and
defining a function comprised in the movement model and describing the capacitance between the micro-object and each of the electrodes as a function of a distance between that micro-object and that electrode.

14. A method according to claim 13, wherein the movement model describes the movement in at least one of one dimension and two dimensions.

15. A method according to claim 11, wherein the error between the estimated density distribution and the target density distribution is expressed using Kullback-Leibler divergence.

16. A method according to claim 11, wherein performing the MPC optimization comprises performing automatic differentiation to compute a plurality of gradients.

17. A method according to claim 11, wherein performing the MPC optimization comprises evaluating at least one expectation using Gauss-Hermite quadrature.

18. A method according to claim 11, wherein the processors comprise at least one of one or more graphics processing units (GPUs) and one or more of tensor processing units (TPUs).

19. A method according to claim 18, wherein two or more of the processors work in parallel to perform the MPC optimization.

20. A method according to claim 11, wherein the electrodes are controlled by photo-transistors, the one or more processors further configured to:
map the electrode potentials in the sequence to a plurality of images;
control a video projector to project the images to the photo-transistors, wherein the phototransistors control the electrodes to generate the sequence of the electrode potentials based on the projected images.

* * * * *